United States Patent
Schweitzer, III et al.

(10) Patent No.: US 10,090,664 B2
(45) Date of Patent: Oct. 2, 2018

(54) TIME-DOMAIN DIRECTIONAL LINE PROTECTION OF ELECTRIC POWER DELIVERY SYSTEMS

(71) Applicant: Schweitzer Engineering Laboratories, Inc., Pullman, WA (US)

(72) Inventors: Edmund O. Schweitzer, III, Pullman, WA (US); Mangapathirao Venkata Mynam, Pullman, WA (US); David E. Whitehead, Pullman, WA (US); Bogdan Z. Kasztenny, Markham (CA); Armando Guzman-Casillas, Pullman, WA (US); Veselin Skendzic, Schwenksville, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 240 days.

(21) Appl. No.: 15/269,959

(22) Filed: Sep. 19, 2016

(65) Prior Publication Data
US 2017/0082675 A1    Mar. 23, 2017

Related U.S. Application Data

(63) Continuation of application No. PCT/US2016/052329, filed on Sep. 16, 2016.
(Continued)

(51) Int. Cl.
*H02H 3/00* (2006.01)
*H02H 3/08* (2006.01)
(Continued)

(52) U.S. Cl.
CPC .......... *H02H 3/083* (2013.01); *G01R 31/085* (2013.01); *H02H 1/0007* (2013.01);
(Continued)

(58) Field of Classification Search
CPC ........ G01R 31/11; H04B 3/46; H02H 1/0007; H02H 3/083
(Continued)

(56) References Cited

U.S. PATENT DOCUMENTS

| 3,585,298 A | 6/1971 | Liberman |
| 3,670,240 A | 6/1972 | Maranchak |

(Continued)

FOREIGN PATENT DOCUMENTS

| EP | 226210 | 12/1986 |
| EP | 241832 | 7/1990 |

(Continued)

OTHER PUBLICATIONS

Harshad Mehta, Fault Location Techniques for High-Voltage DC Lines, EPRI EL-4331 Project 2150-1, 1985.
(Continued)

*Primary Examiner* — Thienvu Tran
*Assistant Examiner* — Lucy Thomas
(74) *Attorney, Agent, or Firm* — Jared L. Cherry; Richard M. Edge; Bradley W. Schield

(57) ABSTRACT

The present disclosure relates to detection of faults in an electric power system. In one embodiment, an incremental quantities subsystem is configured to determine a forward torque, an operating torque, and a reverse torque based on the plurality of time-domain representations of electrical conditions. Each of the forward torque, the operating torque, and the reverse torque may be integrated over an interval. A fault detection subsystem may determine an occurrence of the fault based on a comparison of the operating torque to the forward torque and the reverse torque. Further, a direction of the fault may be determined based on the comparison of the forward torque, the operating torque, and the reverse torque. A fault may be declared based on the comparison and
(Continued)

the direction. A protective action subsystem may implement a protective action based on the declaration of the fault.

20 Claims, 16 Drawing Sheets

Related U.S. Application Data

(60) Provisional application No. 62/220,826, filed on Sep. 18, 2015.

(51) Int. Cl.
    H04B 3/46      (2015.01)
    H02H 1/00      (2006.01)
    G01R 31/08     (2006.01)
    H02H 7/26      (2006.01)

(52) U.S. Cl.
    CPC .............. *H02H 7/265* (2013.01); *H04B 3/46* (2013.01); *H02H 1/0092* (2013.01)

(58) Field of Classification Search
    USPC ........................................................ 361/88
    See application file for complete search history.

(56) References Cited

U.S. PATENT DOCUMENTS

| | | | |
|---|---|---|---|
| 3,878,460 A | 4/1975 | Nimmersjö |
| 3,890,544 A | 6/1975 | Chamia |
| 3,956,671 A | 5/1976 | Nimmersjö |
| 4,053,816 A | 10/1977 | Nimmersjö |
| 4,254,444 A | 3/1981 | Eriksson |
| 4,296,452 A | 10/1981 | Eriksson |
| 4,344,142 A | 8/1982 | Diehr |
| 4,351,011 A | 9/1982 | Liberman |
| 4,377,834 A | 3/1983 | Eriksson |
| 4,499,417 A | 2/1985 | Wright |
| 4,626,772 A | 12/1986 | Michel |
| 4,766,549 A | 8/1988 | Schweitzer |
| 4,797,805 A | 1/1989 | Nimmersjö |
| 4,800,509 A | 1/1989 | Nimmersjö |
| 5,198,746 A | 3/1993 | Gyugyi |
| 5,446,387 A | 8/1995 | Eriksson |
| 5,572,138 A | 11/1996 | Nimmersjö |
| 5,682,100 A | 10/1997 | Rossi |
| 5,729,144 A | 3/1998 | Cummins |
| 6,341,055 B1 | 1/2002 | Guzman-Casillas |
| 6,417,791 B1 | 7/2002 | Benmouyal |
| 6,477,475 B1 | 11/2002 | Takaoka |
| 6,597,180 B1 | 7/2003 | Takaoka |
| 6,798,211 B1 | 9/2004 | Rockwell |
| 7,174,261 B2 | 2/2007 | Gunn |
| 7,535,233 B2 | 5/2009 | Kojovic |
| 7,714,735 B2 | 5/2010 | Rockwell |
| 7,733,094 B2 | 6/2010 | Bright |
| 8,315,827 B2 | 11/2012 | Faybisovich |
| 8,525,522 B2 | 9/2013 | Gong |
| 8,598,887 B2 | 12/2013 | Bjorklund |
| 8,655,609 B2 | 2/2014 | Schweitzer |
| 8,781,766 B2 | 7/2014 | Schweitzer |
| 8,990,036 B1 | 3/2015 | Schweitzer |
| 9,470,748 B2 | 10/2016 | Schweitzer |
| 9,594,112 B2 | 3/2017 | Schweitzer |
| 9,627,881 B2 | 4/2017 | Schweitzer |
| 2001/0012984 A1 | 8/2001 | Adamiak |
| 2002/0165462 A1 | 11/2002 | Westbrook |
| 2004/0189317 A1 | 9/2004 | Borchert |
| 2004/0230387 A1 | 11/2004 | Bechhoefer |
| 2005/0151659 A1 | 7/2005 | Donovan |
| 2006/0012374 A1 | 1/2006 | Kojovic |
| 2008/0077336 A1 | 3/2008 | Fernandes |
| 2009/0230974 A1 | 9/2009 | Kojovic |
| 2011/0058285 A1 | 3/2011 | Wibben |
| 2011/0173496 A1 | 7/2011 | Hosek |
| 2011/0264388 A1 | 10/2011 | Gong |
| 2012/0086459 A1 | 4/2012 | Kim |
| 2013/0021039 A1 | 1/2013 | Bjorklund |
| 2013/0096854 A1 | 4/2013 | Schweitzer |
| 2013/0100564 A1 | 4/2013 | Zhang |
| 2013/0241622 A1 | 9/2013 | Zerbe |
| 2014/0074414 A1 | 3/2014 | Schweitzer, III |
| 2016/0077149 A1 | 3/2016 | Schweitzer |
| 2016/0077150 A1 | 3/2016 | Schweitzer |
| 2016/0084893 A1 | 3/2016 | Schweitzer |
| 2017/0012424 A1 | 1/2017 | Schweitzer |
| 2017/0082675 A1 | 3/2017 | Schweizer |
| 2017/0146613 A1 | 5/2017 | Schweitzer |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

PCT/US2012/060089 Patent Cooperation Treaty, International Search Report and Written Opinion of the International Searching Authority, dated Feb. 5, 2013.

Elhaffar, Power Transmission Line Fault Location Based on Current Traveling Waves. TKK Dissertations 107, Espoo 2008, Helsinki University of Technology. Department of Electrical Engineering, Dec. 2008.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Americo Pinto Moutinho, Fault Location by Traveling Waves: Application in High Impedance Events.

N. Fischer, V. Skendzic, R. Moxley, J. Needs, Protective Relay Traveling Wave Fault Location, Feb. 9, 2012.

PCT/US2014/055894 Patent Cooperation Treaty, International Search Report and Written Opinion of the International Searching Authority, dated Dec. 17, 2014.

PCT/US2014/055896 Patent Cooperation Treaty, International Search Report and Written Opinion of the International Searching Authority, dated Dec. 18, 2014.

PCT/US2014/055919 Patent Cooperation Treaty, International Search Report and Written Opinion of the International Searching Authority, dated Dec. 22, 2014.

Borghetti, et al, "On the use of continuous-wavelet transform for fault location in distribution power systems." International Journal of Electrical Power & Energy Systems. Nov. 2006.

(56) References Cited

OTHER PUBLICATIONS

Maher M.I. Hashim, Hew Wooi Ping, V.K. Ramachandaramurthy, Impedance-Based Fault Location Techniques for Transmission Lines, Sep. 2009.

Zheng et al., Study on Impedance-Traveling Wave Assembled Algorithm in One-Terminal Fault Location System for Transmission Lines, Apr. 2008.

Gabriel Benmouyal, Karl Zimmerman, Experience With Subcycle Operating Time Distance Elements in Transmission Line Digital Relays, Presented at the 37th Annual Western Protective Relay Conference Oct. 2010.

Edmund O. Schweitzer, III, Armando Guzman-Casillas, Mangapathirao Venkat Mynam, Veselin Skendzic, Bogdan Kasztenny, Stephen Marx, Locating Faults by the Traveling Waves They Launch, Feb. 10, 2014.

Toshio Tahagi, Jun-Ichi Baba, Katauhiko Usmura, Tishiaki Sakaguchi, Fault Protection Based on Travelling Wave Theory—Part I Theory, Jan. 24, 1977.

PCT/US2015/050504 Patent Cooperation Treaty, International Search Report and Written Opinion of the International Searching Authority, dated Jan. 29, 2016.

He, Baina, Yunwei Zhao, and Hengxu Ha. "A Novel Wave Based Differential Protection for Distributed Parameter Line." TELKOMNIKA Indonesian Journal of Electrical Engineering TELKOMNIKA 11.9 (2013): 5097-104.

Tang, Lanxi; Dong, Xinzhou; Shi, Shenxing; Wang, Bin; "Travelling Wave Differential Protection Based on Equivalent Travelling Wave", 13th IET International Conference on Developments in Power System Protection (DPSP 2016), Mar. 7-10, 2016.

PCT/US2016/052329 Patent Cooperation Treaty, International Search Report and Written Opinion of the International Searching Authority, dated Jan. 6, 2017.

PCT/US2017/037345 Patent Cooperation Treaty, International Search Report and Written Opinion of the International Searching Authority, dated Aug. 24, 2017.

PCT/US2017/037288 Patent Cooperation Treaty, International Search Report and Written Opinion of the International Searching Authority, dated Aug. 28, 2017.

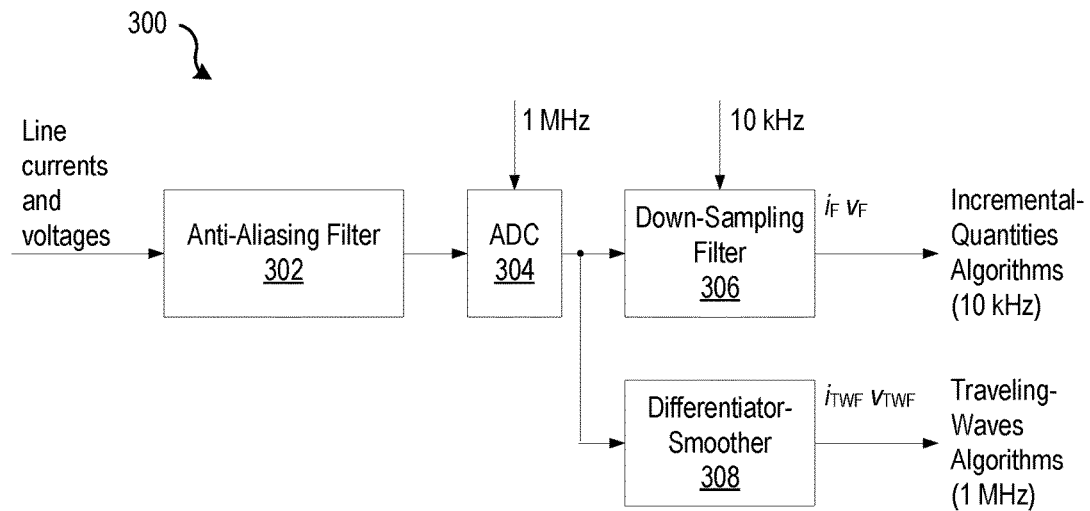
Figure 3
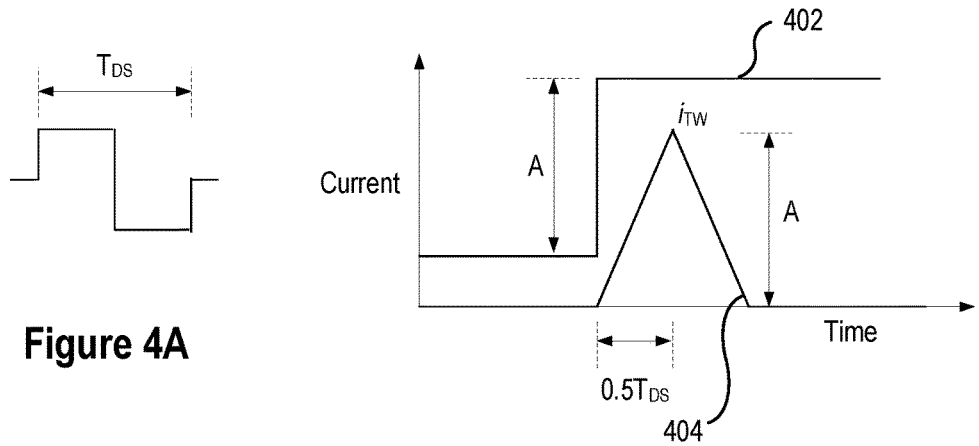
Figure 4A
Figure 4B

TIME-DOMAIN DIRECTIONAL LINE PROTECTION OF ELECTRIC POWER DELIVERY SYSTEMS

RELATED APPLICATION

The present application claims priority as a continuation application under 35 U.S.C. § 365(c) to international patent application no. PCT/US16/52329, filed 16 Sep. 2016 titled "TIME-DOMAIN LINE PROTECTION OF ELECTRIC POWER DELIVERY SYSTEMS", which claims benefit under 35 U.S.C. § 363 and under 35 U.S.C. § 119(e) to U.S. Provisional Patent Application No. 62/220,826, filed Sep. 18, 2015, titled "TIME-DOMAIN LINE PROTECTION OF ELECTRIC POWER DELIVERY SYSTEMS," which is hereby incorporated by reference in its entirety.

TECHNICAL FIELD

This disclosure relates to detecting and locating faults in electric power delivery systems. More particularly, this disclosure relates to using time domain elements and analysis to determine a fault location in electric power delivery systems. In various embodiments, systems and methods consistent with the present disclosure may utilize underreach/overreach, directional, and/or traveling wave elements.

BRIEF DESCRIPTION OF THE DRAWINGS

Non-limiting and non-exhaustive embodiments of the disclosure are described, including various embodiments of the disclosure with reference to the figures, in which:

FIG. 3 illustrates a simplified functional block diagram of a data acquisition system that may be used in connection with incremental-quantity and traveling wave protection algorithms consistent with the present disclosure.

FIG. 4A illustrates a differentiator-smoother data window consistent with embodiments of the present disclosure.

FIG. 4B illustrates a response of a differentiator-smoother to a traveling wave consistent with embodiments of the present disclosure.

DETAILED DESCRIPTION

Figure 1:
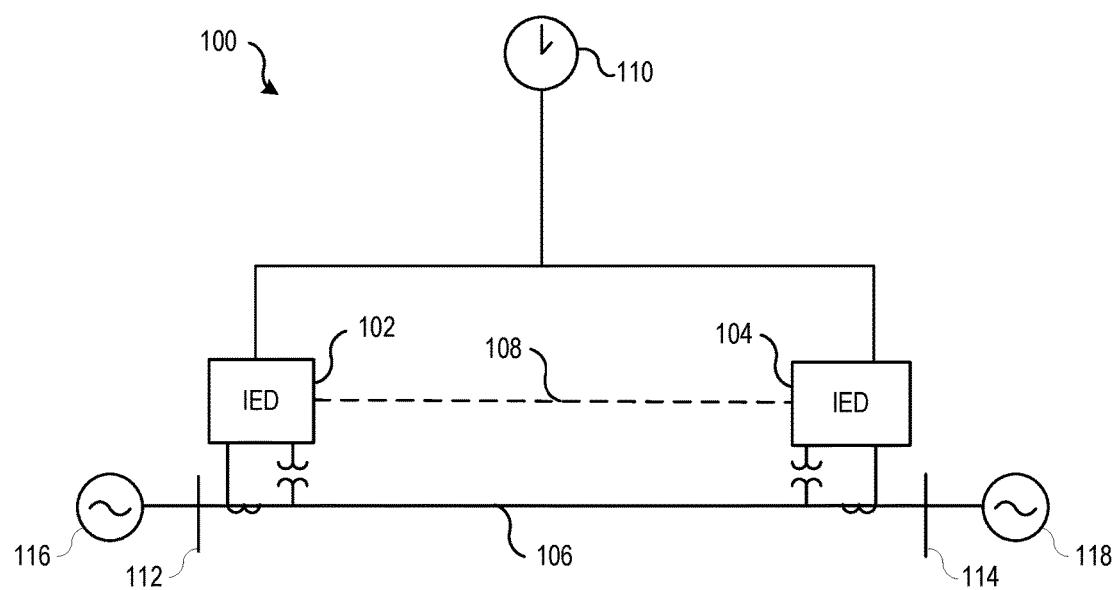
FIG. 1 illustrates a block diagram of a system for detecting a traveling wave and calculating a location of a fault using the detected traveling wave consistent with certain embodiments of the present disclosure.

Improved transmission line protection improves power system stability. In many instances, transmission line protection may be improved by increasing the speed of fault detection and fault clearing. If faults are not cleared before the critical fault clearing time, the system may lose transient stability and possibly suffer a black out. In addition, faster fault clearing increases the amount of power that can be transferred. Faster protection also enhances public and utility personnel safety, limits equipment wear, improves power quality, and reduces property damage.

Most protection principles are based on the fundamental frequency components of voltages and currents. Accurate measurement of a sinusoidal quantity typically takes a cycle. To increase the speed of protection actions, an analysis of transient components may be undertaken in connection with various embodiments of the present disclosure. Further, information relating to electrical conditions may be communicated among devices to provide end-to-end transmission line protection.

Primary protective relaying systems typically operate in one to one-and-a-half cycles, and the breakers interrupt current in one-and-a-half to three cycles, so faults are typically cleared in three to four cycles. Sometimes the relaying system operates faster. For example, sensitive instantaneous overcurrent elements can be used for switch-onto-fault events, and may have an operation time as low as one-quarter of a cycle. Traditional frequency domain techniques obtained by extracting fundamental frequency components (phasors) may be applied to identify a fault after transient signals fade. The filtering necessary for phasor measurement results in operating times of about one power cycle, with the best-case times approaching half a cycle for close-in high-current faults.

However, for purposes of determining stability limits for planning purposes, it is most appropriate to utilize conservative protection operating times. If a breaker fails to trip, breaker failure schemes take over, and fault clearing is delayed until the slowest backup breaker operates, which may be around 10 to 12 cycles. If time-coordinated remote backup protection is used instead of breaker failure protection, the fault clearing time may be as high as a few hundred milliseconds.

High-speed protection devices respond to high-frequency signal components, which may be used to detect faults and to realize various advantages. For example, certain nontraditional energy, such as wind and solar, are connected to the power system through a power electronics interface. As such, these sources typically have little or no inertia. Their control algorithms protect the converters for network fault conditions. As a result, these sources produce voltages and currents that challenge some protection principles developed for networks with synchronous generators. In contrast, high-speed protection devices configured to respond to high-frequency signal components are less dependent on the sources and more dependent on the network itself. As a result, such relays may be useful in applications near non-traditional sources.

Various embodiments consistent with the present disclosure may analyze traveling waves (TWs) to aid in the detection of faults. When a fault occurs in an electric power system, traveling waves are launched from the fault and travel outward at a velocity near the speed of light. The traveling waves are reflected by buses and other discontinuities according to their corresponding characteristic impedances. In the initial stage of the fault, the electric power system may behave like a distributed parameter network. Accordingly, the traveling waves may be described by the propagation velocity, the reflection and transmission coefficients, and the line characteristic impedance. Using a traveling wave detection algorithm, a high-speed relay may be able to detect a fault and initiate corrective action in less than 1 millisecond consistent with certain embodiments of the present disclosure. Various elements disclosed herein may be implemented using high-speed sampling systems and high-speed systems for filtering, integration, comparison, timers, and logic operations to improve the response time of such elements.

After a few roundtrip reflections, traveling waves from a fault recombine into stationary waves, and the power system may be approximated using a lumped parameter RLC network in a transient state. Given the speed of traveling waves, such a condition may be realized very shortly following the occurrence of a fault. TWs from a fault anywhere on a 100-mile line reach both ends within 600 microseconds. Various embodiments consistent with the present disclosure may analyze the "lumped circuit theory" transient waveforms to detect a fault and initiate corrective action within milliseconds consistent with certain embodiments of the present disclosure.

Various techniques may be used to simplify models utilized in certain embodiments. For example, certain embodiments may analyze incremental quantities, which are signals that appear due to a fault and do not contain load voltages or currents. Incremental quantities may simplify the line and system representation by eliminating power sources and leaving the fault as the only "source" in the equivalent network. In other words, the driving force of the transient is the fault, and the driving force of the steady-state response is the set of system fundamental frequency sources (e.g., generators).

Ultra-high-speed principles allow relays to identify events that are located within the protected zone but are not necessarily permanent faults. Incipient cable failures or surge arrester conduction events may present detection challenges to existing feeder and bus relays, respectively. Similarly, the ultra-high-speed line protection needs to ensure that an in-zone event is a legitimate fault. Various embodiments consistent with the present disclosure relate to protection systems using time-domain principles using incremental-quantity and traveling wave elements in a communications-assisted protection system.

In some embodiments, the time-domain elements disclosed herein may be operated in addition to phasor-based protection elements. In such arrangements, the time-domain elements may be biased for speed of operation rather than dependability. These high-speed time-domain elements may identify and clear a large percentage of line faults. As a result, the dependable but slower operating phasor-based protection elements may identify and clear any faults unresolved by the time-domain elements. The combined result of such a system may reduce the average operating time of the system.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be illustrated as software modules or components. In other embodiments, hardware-implemented embodiments may be used. Such embodiments may utilize, among other technologies, field-programmable gate arrays. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

FIG. 1 illustrates a block diagram of a system 100 for detecting and calculating a location of a fault using time-domain principles and elements further described herein. System 100 may include generation, transmission, distribution and/or similar systems. System 100 includes a conductor 106 such as a transmission line connecting two nodes, which are illustrated as a local terminal 112 and a remote terminal 114. Local and remote terminals 112 and 114 may be buses in a transmission system supplied by generators 116 and 118, respectively. Although illustrated in single-line form for purposes of simplicity, system 100 may be a multi-phase system, such as a three-phase electric power delivery system.

System 100 is monitored by IEDs 102 and 104 at two locations of the system, although further IEDs may also be utilized to monitor further locations of the system. As used herein, an IED (such as IEDs 102 and 104) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. IEDs 102 and 104 may obtain electric power system information using current transformers (CTs), potential transformers (PTs), Rogowski coils, voltage dividers and/or the like. IEDs 102, 104 may be capable of using inputs from conventional instrument transformers such as CTs and PTs conventionally used in monitoring of electric power delivery. IEDs 102 and 104 may also receive common time information from a common time source 110.

Common time source 110 may be any time source capable of delivering a common time signal to each of IEDs 102 and 104. Some examples of a common time source include a Global Navigational Satellite System (GNSS) such as the Global Positioning System (GPS) delivering a time signal corresponding with IRIG, a WWVB or WWV system, a network-based system such as corresponding with IEEE 1588 precision time protocol, and/or the like. According to one embodiment, common time source 110 may comprise a satellite-synchronized clock (e.g., Model No. SEL-2407, available from SEL). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

A data communication channel 108 may allow IEDs 102 and 104 to exchange information relating to, among other things, voltages, currents, time-domain fault detection and location. According to some embodiments, a time signal based on common time source 110 may be distributed to and/or between IEDs 102 and 104 using data communication channel 108. Data communication channel 108 may be embodied in a variety of media and may utilize a variety of communication protocols. For example, data communication channel 108 may be embodied utilizing physical media, such as coaxial cable, twisted pair, fiber optic, etc. Further, data communication channel 108 may utilize communication protocols such as Ethernet, SONET, SDH, or the like, in order to communicate data.

In several embodiments herein, traveling waves on the electric power delivery system may be used to detect and calculate location of a fault. Two-end fault locating methods, which may be referred to herein as Type D methods, may use a time difference between a traveling wave captured at both terminals along with the line length and wave propagation velocity to compute the fault location. Measurement devices at the line terminals detect the traveling waves and time stamp the arrival of the wave using a common time reference (e.g., IRIG-B or IEEE 1588). In certain embodiments, a distance to a fault location (m) is calculated using Eq. 1.

$$m = \frac{1}{2}[L + (t_L - t_R) \cdot v] \qquad \text{Eq. 1}$$

where:
$t_L$ is the front wave arrival time at the L Terminal,
$t_R$ is the front wave arrival time at the R Terminal,
v is the wave propagation speed,
L is the line length.

Traditionally these solutions use a master station that accesses the wave arrival times and estimates the fault location. Recently, line relays equipped with traveling wave fault locating functionality may exchange the wave arrival times, calculate the fault location, and make the fault location available at the relay. One of the key benefits of using the Type D method is its simplicity and immunity to reflections.

Figure 2A:
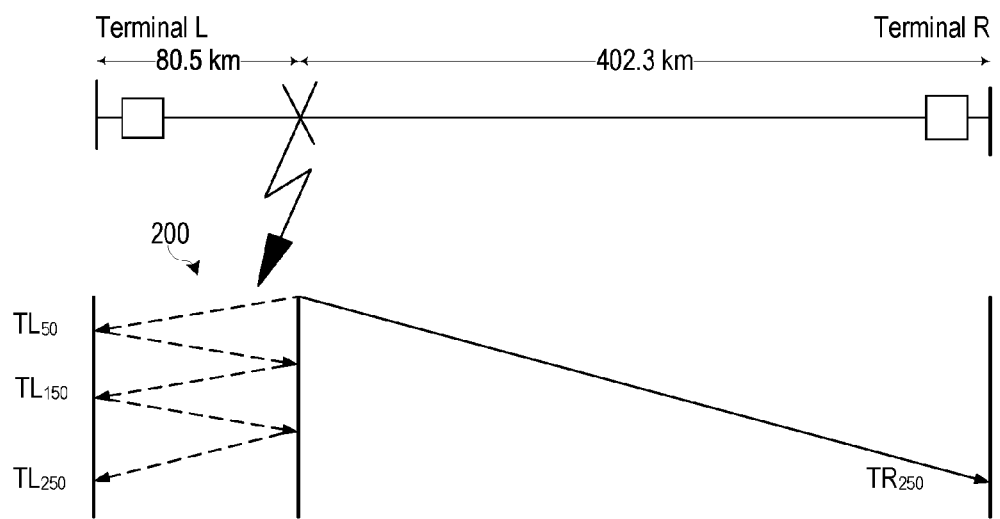
FIG. 2A illustrates a lattice diagram showing incident and reflected traveling waves over a relative time scale created by a fault event on a 300 mile (482.8 km) long transmission line consistent with certain embodiments of the present disclosure.

FIG. 2A illustrates a lattice diagram 200 showing incident and reflected traveling waves created by a fault consistent with certain embodiments of the present disclosure. In the illustrated embodiment, a fault is located 50 miles (80.5 km) from a first terminal on a 300 mile (482.8 km) long line. The incident wave triggered by the fault reaches the Terminal L at time $TL_{50}$, and reaches the Terminal R at time $TR_{250}$. The Type D method may use the $TL_{50}$ and $TR_{250}$ to compute the fault location while ignoring all the other waves. When desired, remaining wave arrivals can be used to improve the initial fault location estimate.

Figure 2B:
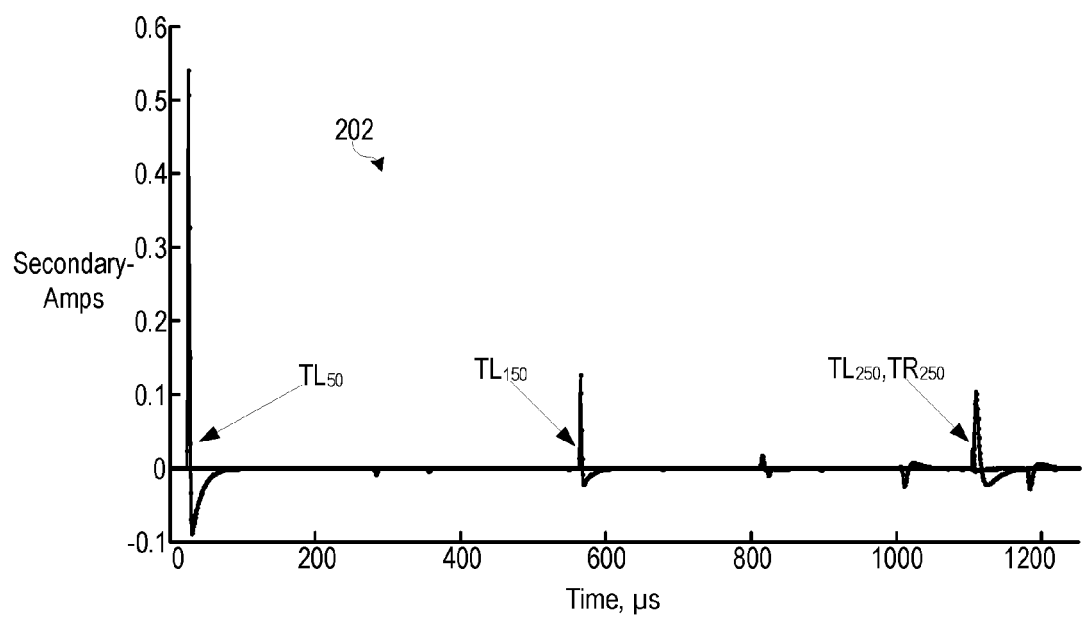
FIG. 2B illustrates the incident and reflected traveling waves as a function of current over time from the fault illustrated in FIG. 2A consistent with certain embodiments of the present disclosure.

FIG. 2B illustrates the incident and reflected traveling waves as a function of current over time 202 from the fault illustrated in FIG. 2A consistent with certain embodiments of the present disclosure. As illustrated, the magnitude of the reflected traveling waves diminishes with each reflection. Time alignment of data samples received at both Terminal L and Terminal R allows for comparison of the incident and reflected waves from both terminals.

A single-end fault locating method, which is also referred to herein as a Type A fault locating method, uses the time difference between the first arrived traveling wave and a subsequent reflection from the fault or the remote terminal. The Type A method is not dependent on a communication channel to the remote terminal. However, the challenge is to identify and select the appropriate reflection. The Type A method may be useful, according to some embodiments, when the fault location is computed during reclosing events on a permanent fault when one of the terminals is open.

FIG. 2B illustrates the reflections from the fault at terminal L. The polarity, amplitude, and arrival time of the reflected waves can be used to identify the reflected wave from the fault or the remote terminal and calculate the fault location. At the L Terminal, the Type A method may use points labeled $TL_{50}$ and $TL_{150}$ in FIG. 2B to compute the fault location while ignoring other waves and reflections. In certain embodiments, a distance to a fault location (m) may be calculated using the Type A method using Equation 2.

$$m = \left(\frac{t_{L2} - t_{L1}}{2}\right) \cdot v \qquad \text{Eq. 2}$$

where:
$t_{L2}$ is the arrival time of the first reflection from the fault at the L Terminal;
$t_{L1}$ is the arrival time of the initial wave front from the fault at the L Terminal; and
v is the wave propagation speed.

In various embodiments, the polarity of the traveling wave may be used to determine the direction to the fault. Voltage and current polarities are opposite if the fault is in the forward direction. If the fault is in the reverse direction, the voltage and current traveling waves have the same polarity.

Figure 2C:
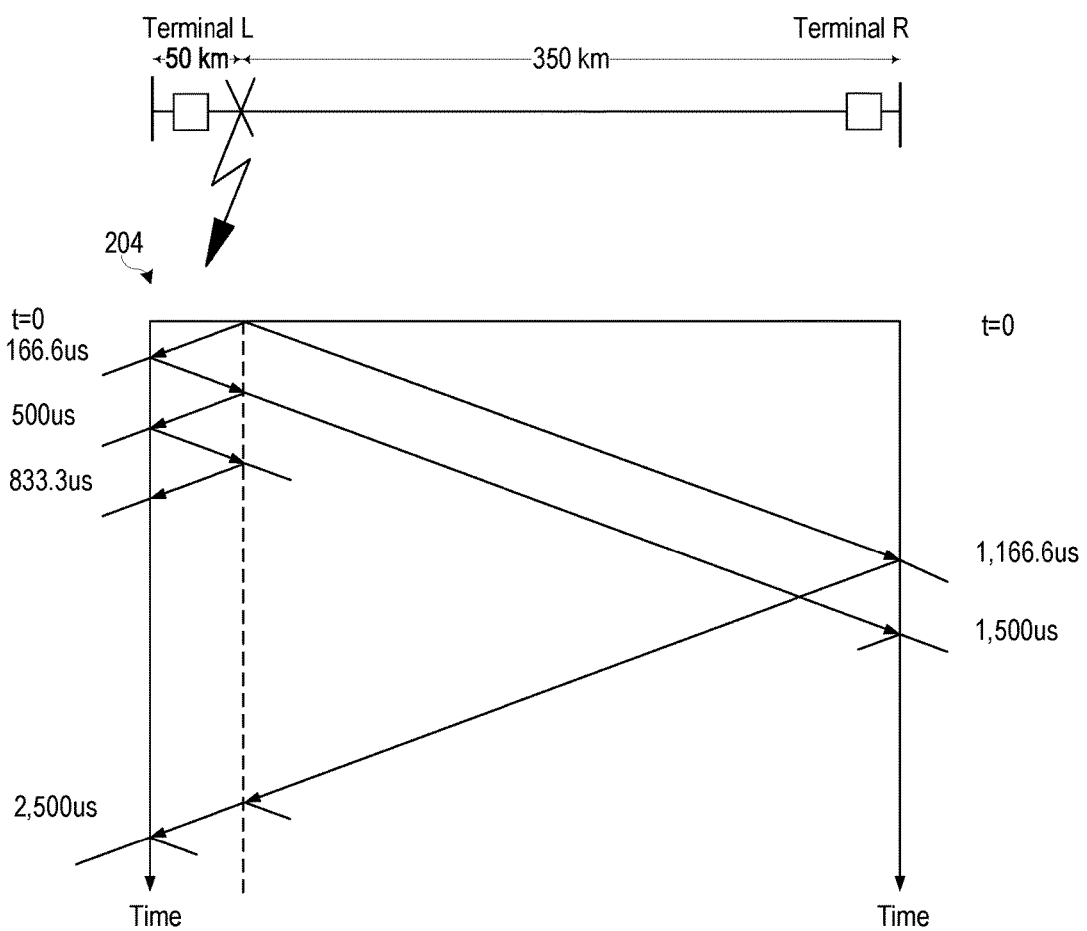
FIG. 2C illustrates a lattice diagram showing the incident and reflected traveling waves at a remote terminal and a local terminal from a fault event on a 400 km long transmission line consistent with certain embodiments of the present disclosure.

FIG. 2C illustrates a lattice diagram 204 showing the incident and reflected traveling waves at a remote terminal and a local terminal from a fault event on a 400 km long transmission line consistent with certain embodiments of the present disclosure. Assuming a $3 \times 10^8$ m/s propagation velocity, a fault located at 50 km on a 400 km line would result in a time lag between the initial front-wave and the first legitimate reflection from the fault that may be calculated using Eq. 3.

$$\frac{2 \times 50 \times 10^3}{3 \times 10^8} = 333 \ \mu s \qquad \text{Eq. 3}$$

Further, knowing that the line is 400 km long, it is possible to obtain a delay time estimate for the first wave reflected from the remote terminal. With respect to the instant of fault occurrence, the first reflection from the remote terminal will be per Eq. 4.

$$\frac{(2*400 - 50)*10^3}{3*10^8} = 2,500 \ \mu s \qquad \text{Eq. 4}$$

As illustrated in FIG. 2C, a local relay generates measurement with respect to the first arriving wave, which is 166.6 μs, because of the 50 km distance between the local relay and the fault. The estimate determined using Eq. 4 may provide a window in which a reflected wave may be expected after the initial front wave.

While the previous two-ended and single-ended traveling wave fault location methods provided a more accurate estimate of the location of the fault than was available using, for example, impedance-based methods, these methods were constrained due to communication system limitations and reliance on frequency-domain measurements. In the frequency domain, measurements of electric power system voltage and current require a full electric power system cycle to calculate with adequate accuracy. Thus, previous fault detection and location algorithms could not determine a location of a fault faster than one electric power system cycle, for most faults.

The time-domain electric power system fault detection and location techniques described herein do not require a complete electric power system cycle to calculate measurements of voltage or current. Conventional PTs and CTs may be used to provide signals corresponding to the voltage and current of the electric power delivery system, which may be used for fault detection and location calculations in less than one electric power system cycle.

Unless otherwise defined herein, the following references are used to represent the following signals or settings:
$v_{100}$ relay phase to ground voltage, phase ϕ.
$i_{100}$ relay phase current, phase ϕ.
v loop voltage.
i loop current.
Δv loop incremental voltage.
Δi loop incremental current.
$\Delta i_Z$ loop incremental replica current.
$v_{TW}$ voltage traveling wave.
$i_{TW}$ current traveling wave.
$Z_1$, $Z_0$ line positive- and zero-sequence impedances.
$m_0$ TD21 reach in per unit.
$Z_F$, $Z_R$ TD32 forward and reverse impedance thresholds.
$T_L$ line propagation time.
P pickup of the TW87 element.
OC trip overcurrent supervision for a permissive overreaching transfer tripping (POTT) scheme and TW87.

FIG. 3 illustrates a simplified functional block diagram of a data acquisition system 300 that may be used in connection with incremental-quantity and traveling wave protection algorithms consistent with the present disclosure. In the illustrated embodiment, system 300 may sample line currents and voltages at a high rate (e.g., 1 MHz), suitable for TW protection and fault locating. The samples may be aligned with a time input (not shown) in some embodiments. An anti-aliasing 302 filter may process the incoming line currents and voltages to avoid aliasing. An analog-to-digital converter (ADC) 304 may create digital representations of the incoming line current and voltage measurements. A down-sampling filter 306 may be configured to create a down-sampled representation of the at a lower data rate (e.g., 10 kHz). The output of the down-sampling filter 306, $i_f$ and $v_f$, may be used in various algorithms based on incremental-quantities. The output of a differentiator-smoother 308, $i_{TWF}$ and $v_{TWF}$ may be used in various algorithms based on traveling waves.

FIG. 4A illustrates a differentiator-smoother data window consistent with embodiments of the present disclosure. In various embodiments, the length of a differentiator-smoother window, $T_{DS}$, may be a period of a few tens of microseconds. Over such a short period of a time, the current in an electric power system is quasi-constant (i.e., changing slowly). In contrast, a traveling wave represents a sharp change from one quasi-steady level to a different quasi-steady level. A differentiator-smoother filter consistent with the present embodiment may respond to the rate of change of the incoming signal and may smooth the output.

FIG. 4B illustrates a response of a differentiator-smoother to an ideal step change 402 consistent with embodiments of the present disclosure. A differentiator-smoother may respond to an ideal step change 402 with a triangle-shaped output 404. The differentiator-smoother may respond to a transition of the ideal step change 402 with a parabola-shaped output. In various embodiments, the time associated with the peak of the output as the TW arrival time may be determined. The time of the peak may correspond to half of the differentiator-smoother window length, $0.5T_{DS}$. A gain of the differentiator-smoother, A, may be selected so that the peak value of the output corresponds to the magnitude of the step change in the input. Accordingly, the value of the $i_{TW}$ signal may retain information about the magnitude of the TW in some embodiments.

Figure 5:
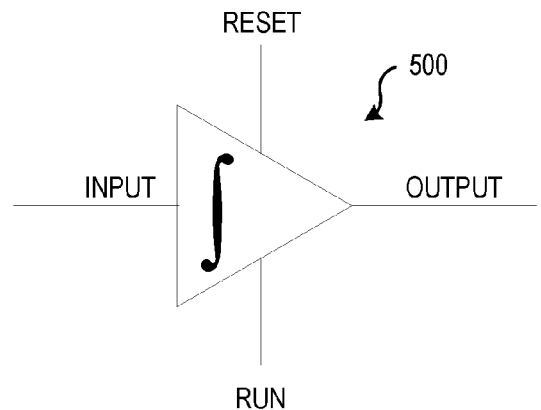
FIG. 5 illustrates an integrator with control inputs consistent with embodiments of the present disclosure.

FIG. 5 illustrates an integrator 500 with control inputs consistent with embodiments of the present disclosure. Integrator 500 may accumulate input values. In various embodiments, integrator 500 may be well suited for monitoring incremental quantities or traveling waves because these signals are typically zero or near zero prior to an event. An integrated signal may represent a proxy for a confidence level in measured signals because the energy of the input signal accumulates over time. Integrating a signal that develops from zero does not slow down decisions based on the integrated signal when comparing two or more of such signals. In the illustrated embodiment, integrator 500 has two control inputs (RUN and RESET) that control its behavior under different operating conditions. The RUN input may be used to enable integrator 500 to accumulate the input signal. The reset signal may be used to set the value of integrator 500 to an initial value (e.g., zero).

Figure 6:
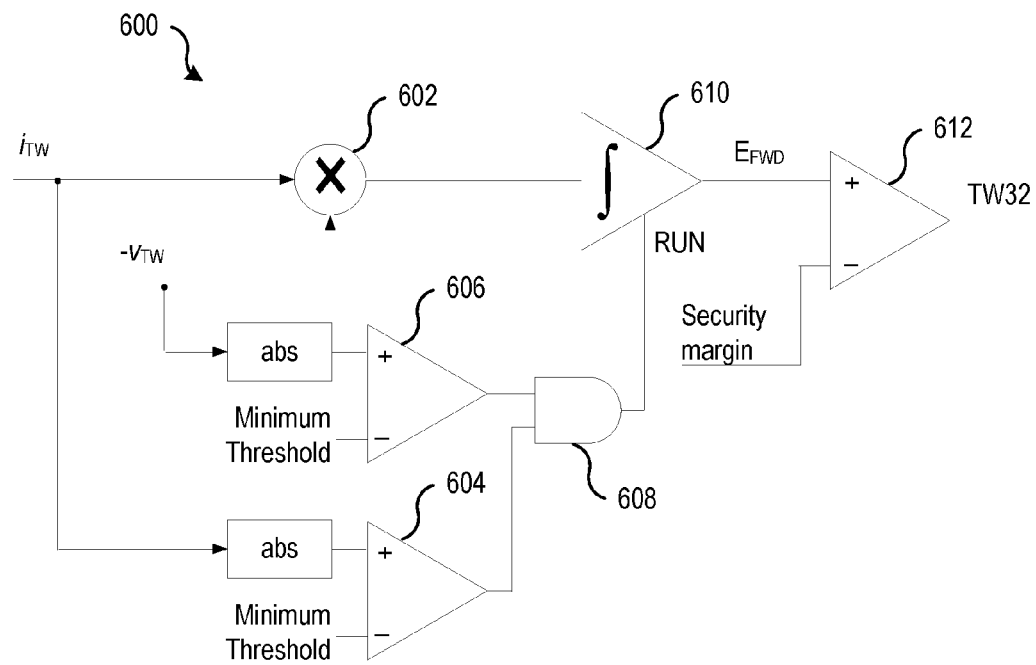
FIG. 6 illustrates a simplified functional block-diagram of a traveling wave detection system consistent with embodiments of the present disclosure.

FIG. 6 illustrates a simplified functional block-diagram of a traveling wave detection system 600 consistent with embodiments of the present disclosure. Traveling waves may have a wide-bandwidth, and accordingly a wide-bandwidth voltage transformer may be used to measure and quantify voltage traveling waves. In various embodiments consistent with the present disclosure, however, a capacitive coupling voltage transformer (CCVT) may be used to measure voltage traveling waves because of inter-winding capacitance across the step-down transformer and the inter-turn capacitance across the tuning reactor of the CCVT. Although a measurement may not fully represent the magnitude of the traveling wave voltage, the representation may be accurate in terms of the arrival time and polarity. In various embodiments, the timing and arrival of the traveling wave may be sufficient for reliable operation of the systems and methods disclosed herein.

System 600 may receive as inputs $i_{TW}$ and $-v_{TW}$, a security margin, and minimum thresholds in various embodiments. In the illustrated embodiment, a traveling wave torque is calculated using a multiplier 602 based on the product of the traveling wave current, $i_{TW}$, and the sign-inverted traveling wave voltage $-v_{TW}$. The sign-inverted traveling wave voltage may be used so that the torque is positive for forward events.

The absolute values of the traveling wave current, $i_{TW}$, and the traveling wave voltage $-v_{TW}$, may be compared to minimum thresholds by comparators 604 and 606, respectively. The output of comparators 604 and 606 may provide inputs to an AND gate 608. The output of AND gate 608 may be connected to the RUN input of an integrator 610. Operation of AND gate 608 may enable the integrator 610 only when the voltage and current signals exceed the minimum thresholds. This comparison and the minimum threshold may provide added security against erroneous detection. When the integrator 610 is enabled, the torque may be integrated over time. Each traveling wave coming from the forward direction may increase the value of the integral, while each traveling wave coming from behind the relay may reduce the value of the integral. The first traveling wave is higher in magnitude than the subsequent reflections. As a result, the integrated value is a reliable indication of the fault direction even as multiple reflected traveling waves are integrated over a period of time. The output of the integrator, $E_{FWD}$, and a security margin may provide inputs to a comparator 612. The output TW32 may be asserted when the output of the integrator, $E_{FWD}$, exceeds the security margin. In various embodiments, a distinct system 600 may be used to monitor different phases within a multi-phase electric power system.

Figure 7:
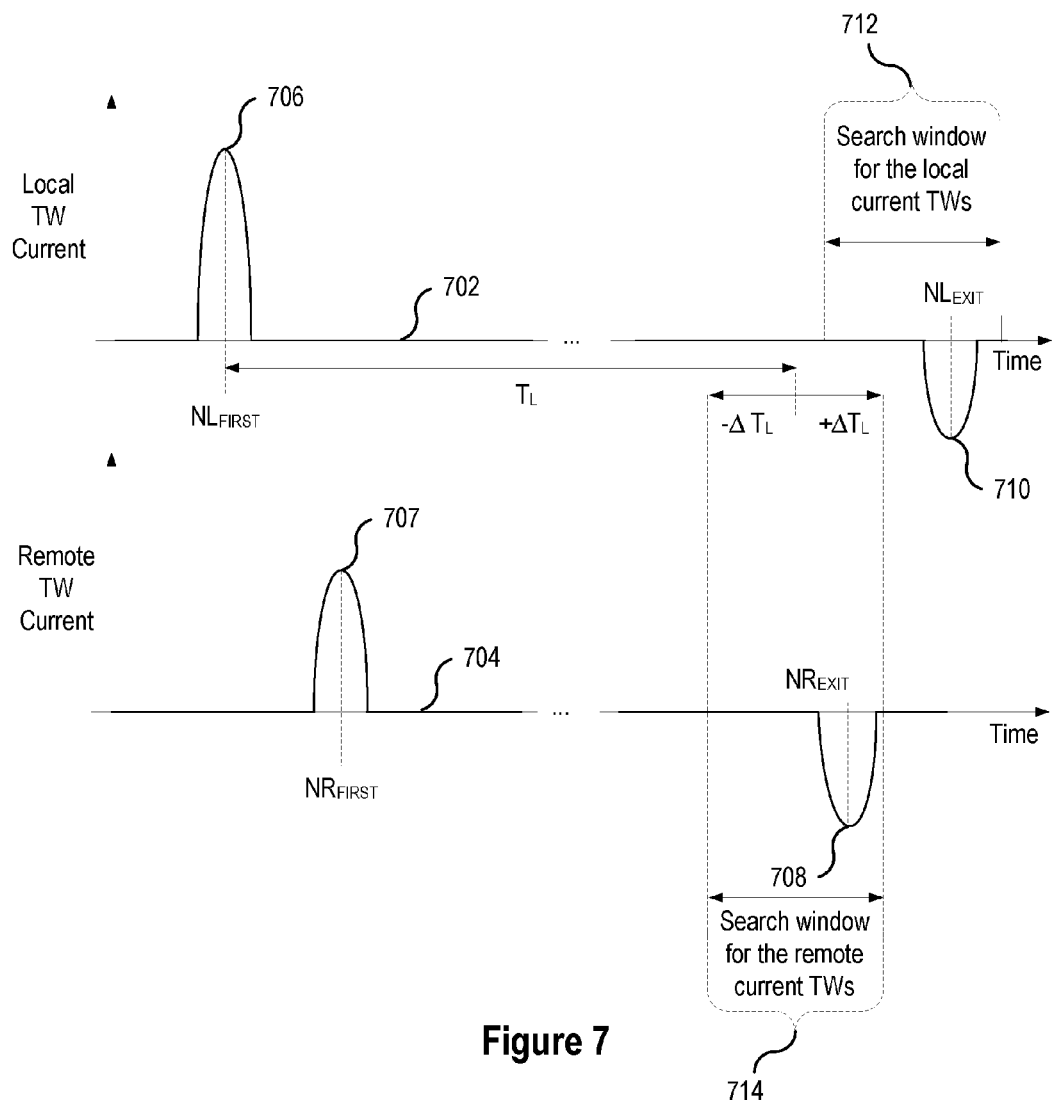
FIG. 7 illustrates traveling waves launched by a fault as detected at terminal L and a remote terminal consistent with embodiments of the present disclosure.

FIG. 7 illustrates traveling waves launched by a fault as detected at a local terminal and a remote terminal consistent with embodiments of the present disclosure. The traveling waves are detected at the local terminal 706 at time or index $NL_{FIRST}$, and at the remote terminal at time or index $NR_{FIRST}$. These will be the first waves recorded after the quiescent steady state prior to the disturbance. With knowledge of the line length and adjusting for an error, an expected window for the arrival of the exiting traveling wave at the remote terminal $NR_{EXIT}$ 708 may be calculated from the arrival time of that traveling wave at the local terminal.

A traveling wave detection system may determine the arrival of the traveling wave at both the local and remote terminals. For illustration in FIG. 7, these times are labeled as 706 ($NL_{FIRST}$), 707 ($NR_{FIRST}$), respectively, for the first traveling waves at the local and remote terminals; and 710 ($NL_{EXIT}$) and 708 ($NR_{EXIT}$), respectively, for the exiting traveling waves at the local and remote terminals. It should be noted that the traveling wave may be first received at the remote terminal under some fault circumstances such as, for example, when the fault is closer to the remote terminal.

Based on the arrival time of the first traveling wave at the local terminal, as illustrated, a search window 714 for the exiting traveling wave at the remote terminal may be established. As mentioned, in circumstances where the first traveling wave is received at the remote terminal, a time window for the exiting traveling wave at the local terminal may be established using the principles disclosed herein. These windows may be positioned after the nominal line propagation time, $T_L$. Further, a margin of error may be included for errors due to, for example, line sag or other variabilities in propagation time, $\pm \Delta T_L$.

As an example, for a 300 km line, the nominal propagation time may be around 1,000 μs ($T_L$=1,000), and a ±0.3% variability due to line propagation errors (such as sag)

results in an offset of about ±3 µs. Thus, for this example, the time window for the exit traveling wave is expected between sample 997 (assuming one sample per µs) and sample 1,003, after the first traveling wave is detected at the other terminal. A larger margin may be applied to account for other errors such as: the accuracy of time alignment between the remote and local IEDs performing the traveling wave differential fault detection; inaccuracy of the propagation time setting; or the like.

Using the time windows 712 and 714, the maximum absolute peak value in the time window for the local and remote terminals may be identified.

Using these indices, the magnitudes of the traveling wave fault currents at the local and remote terminals (IL and IR), operating traveling wave current ($I_{DIF}$), and restraining traveling wave currents ($I_{RST}$) may be calculated according to Equations 5-10:

$$IL = C \cdot \left| \sum_{k=-M}^{k=M} i_{TWL(NL_{FIRST}-k)} \right| \quad \text{Eq. 5}$$

$$IR = C \cdot \left| \sum_{k=-M}^{k=M} i_{TWR(NR_{FIRST}-k)} \right| \quad \text{Eq. 6}$$

where C is selected as a scaling factor to maintain a unity gain for an ideal traveling wave in the shape of a step change using Equation 7:

$$C = \frac{T_{DS}}{2 \cdot M \cdot (T_{DS} - M)} \quad \text{Eq. 7}$$

For example, when the raw current changes steeply by 100 A, the peak traveling wave at the output of the differentiator-smoother is 100 A, and the magnitude measured is also 100 A.

$$I_{DIF} = C \cdot \left| \sum_{k=-M}^{k=M} (i_{TWL(NL_{FIRST}-k)} + i_{TWR(NR_{FIRST}-k)}) \right| \quad \text{Eq. 8}$$

If $NL_{FIRST} < NR_{FIRST}$, then Equation 9, otherwise Equation 10, is used to calculate the restraining traveling wave current:

$$I_{RST} = C \cdot \left| \sum_{k=-M}^{k=M} (i_{TWL(NL_{FIRST}-k)} - i_{TWR(NR_{EXIT}-k)}) \right| \quad \text{Eq. 9}$$

$$I_{RST} = C \cdot \left| \sum_{k=-M}^{k=M} (i_{TWR(NR_{FIRST}-k)} - i_{TWL(NL_{EXIT}-k)}) \right| \quad \text{Eq. 10}$$

Equations 9 and 10 compare the first traveling that arrived at either of the local or remote terminals, with the exit traveling wave at the other terminal.

The fault location may be calculated using Equation 11:

$$m_{87} = 0.5 \left( 1 + \frac{NL_{FIRST} - NR_{FIRST}}{T_L} \right) \quad \text{Eq. 11}$$

The sliding window may not be used, and Equations 6-11 may be calculated a single time, at the time that the exit indices ($NL_{EXIT}$ and $NR_{EXIT}$) are found. Having Equations 6-11 calculated, the traveling wave differential logic illustrated in FIG. 8 may be applied.

Figure 8:
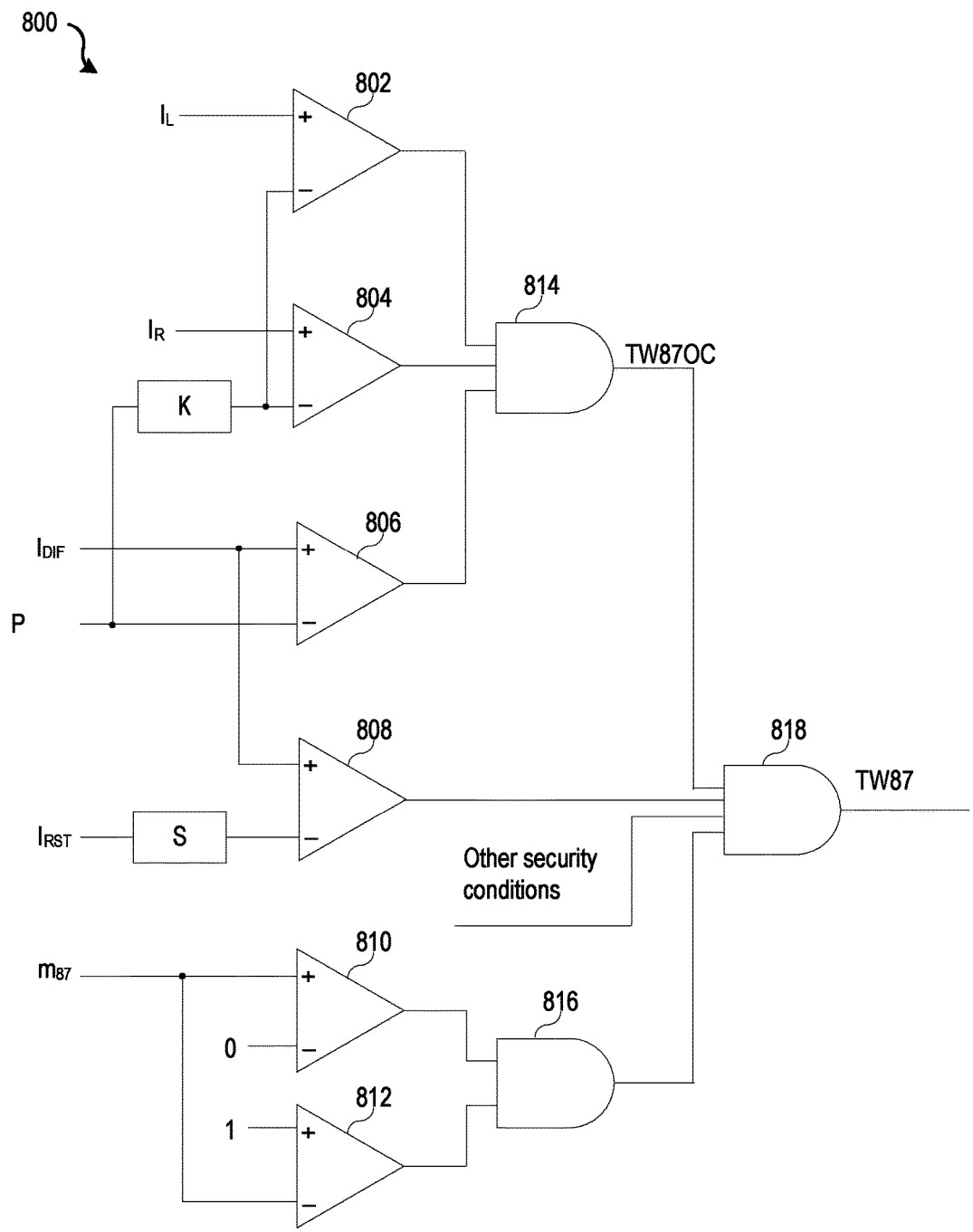
FIG. 8 illustrates a logic diagram of a traveling wave directional element consistent with embodiments of the present disclosure.

FIG. 8 illustrates a logic diagram of a traveling wave directional element 800 consistent with embodiments of the present disclosure. For an event within a zone of protection, an operating signal is expected to be much greater than a restraining signal. For an event outside of the zone of protection, the operating signal is expected to be lower than the restraining signal. Thus, a scaled restraining signal $I_{SRT}$ is compared by comparator 808 with the operating signal $I_{DIF}$. If the operating signal $I_{DIF}$ is greater than the scaled restraining signal $I_{SRT}$, the output of comparator 808 is enabled. For a fault within a zone of protection, $m_{87}$ is expected to be between 0 and 1. Thus, the value of $m_{87}$ is compared with zero by comparator 810, and with one by comparator 812. When $m_{87}$ is both greater than zero and less than one, the outputs of comparators 810 and 812 may be asserted.

To avoid responding to noise coupled to the secondary wiring or the relay input circuitry, both local and remote traveling wave magnitudes individually may also be compared to a minimum threshold. Thus, the local traveling wave current $I_L$ may be compared with a multiple (K) of the threshold level P in comparator 802, and the remote current $I_R$ is compared with a multiple (K) of the threshold level P in comparator 804. In one specific embodiment, the multiple (K) of P is 0.2. If both the local and remote traveling wave currents $I_L$ and $I_R$ are above the multiple of the threshold level P, and the differential current $I_{DIF}$ is above the threshold level P (signaled by comparator 806), then AND gate 814 may be asserted. The output of AND gates 814 and 816, the output of comparator 808, and other security conditions may all need to be asserted to activate AND gate 818 (TW87OC). The output of AND gate 818 may correspond to detection of a traveling wave differential fault if all of the following conditions are satisfied: the local and remote traveling wave currents $I_L$ and $I_R$ are above a multiple of the threshold level P; the operating current $I_{DIF}$ is above the threshold P; the operating current is above the scaled restraining current $I_{SRT}$; and, $m_{87}$ is between 0 and 1. The logic illustrated in FIG. 8 may be associated with each phase of a multi-phase electrical power system.

Figure 9:
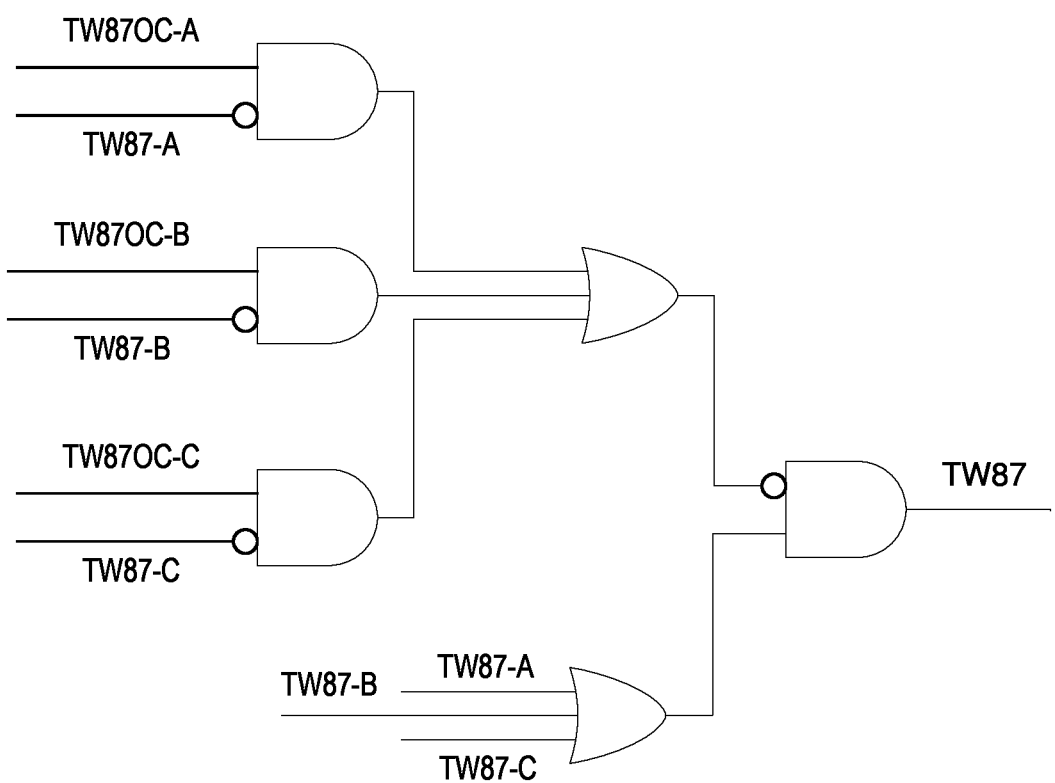
FIG. 9 illustrates a phase agreement logic diagram that may be used to supervise a three-phase system for traveling wave differential faults.

FIG. 9 illustrates a phase agreement logic diagram that may be used to supervise a three-phase system for traveling wave differential faults. According to FIG. 9, if any of the TW87OC and TW87 outputs (e.g., the outputs generated by the system shown in FIG. 8) for the same phase differ, then the element does not output a fault signal. However, if a TW87OC output and a TW87 output for the same phase do not differ, a differential fault signal (TW87) may be asserted.

Traveling waves may be launched by any sudden voltage change at a point on a protected power line. For example, switching in-line series capacitors, reactors, or a shield wire lightning strike may launch traveling waves. Therefore, in some embodiments, the traveling wave differential element logic may require overcurrent supervision for security. That is, a routine switching event that launches a traveling wave would not be detected as a traveling wave fault by the traveling wave fault differential element.

Further, using the values calculated during differential protection, a location dependent supervision may be applied. From Equation 11 the location of the fault on the line where the traveling wave originated is known. If the location where the fault originated includes equipment that may launch a traveling wave in its normal operation, an IED may use a higher threshold value.

Figure 10:
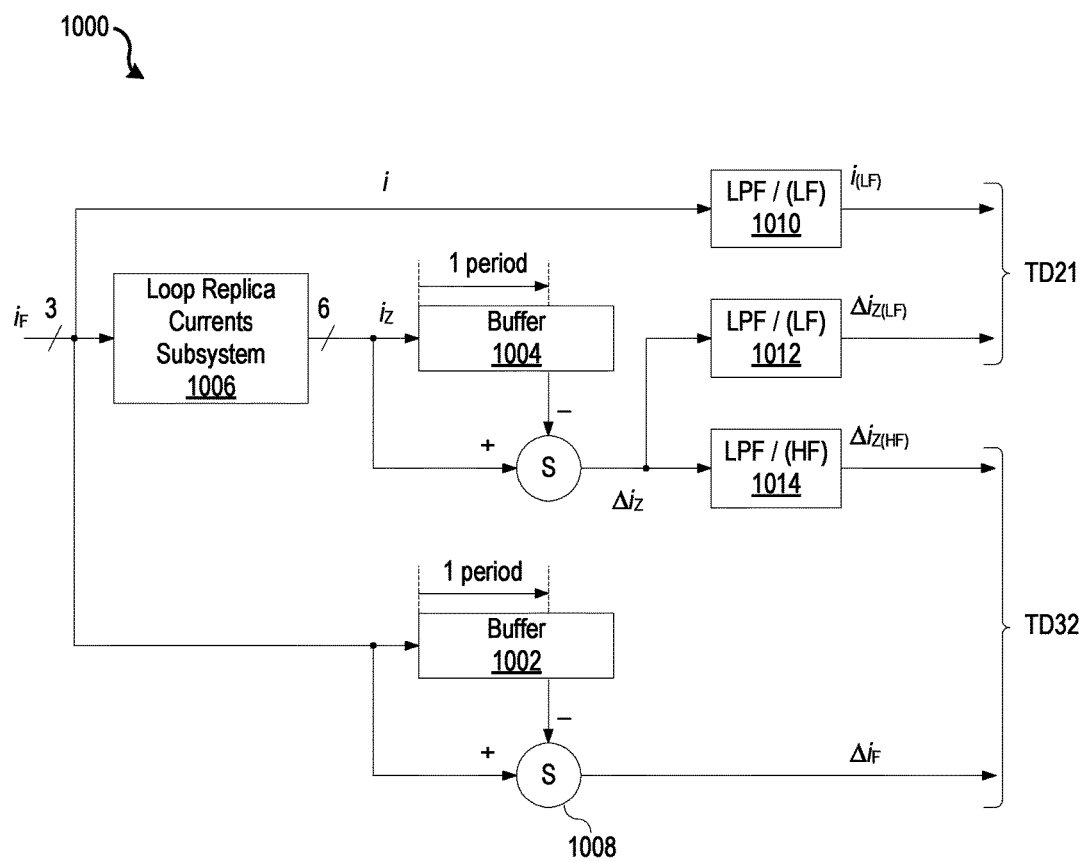
FIG. 10 illustrates a block diagram of a filter system that may be used in connection with incremental-quality algorithms consistent with the present disclosure.

FIG. 10 illustrates a block diagram of a system 1000 that may be used to determine incremental quantities based protection elements consistent with the present disclosure. The illustrated embodiment refers to a current path; however, a system configured to determine incremental quantities for a voltage path may be implemented using the same design without the loop replica currents 1006. Using buffer 1002 and adder 1008, the incremental line current ($\Delta i_\Phi$) may be determined by subtracting one-period-old values from the line currents ($i_\Phi$). These signals receive no additional low-pass filtering and, therefore, incur no extra delay. These signals may be used by a TD32 element for an initial boost in speed and security during the first millisecond of a fault.

Six loop replica currents ($i_z$) may be determined by loop replica currents subsystem 1006 from the line currents, taking into account the three-phase nature of the protected line and the L/R ratios of the six measurement loops (three phase-to-ground loops and three phase-to-phase loops). The 3×3 R and L matrices used for these calculations from the magnitudes and angles of the positive- and zero-sequence line impedances may be extracted. Using buffer 1004, system 1000 may calculate the loop incremental replica currents ($\Delta i_z$) by subtracting the one-period-old values.

Low pass filters (LPF) 1010, 1012, and 1014 may be used to reduce the influence of transients in the operating signals. The filters labeled as LF (lower frequency) (i.e., filters 1010 and 1012) are low frequency filter (e.g., in the range of hundreds of hertz). This level of filtering may achieve a desired reach accuracy of the TD21 element. The filter labeled HF (higher frequency) (i.e., filter 1014) may pass higher frequency signals (e.g., in the range of 1 kHz). This relaxed level of filtering is suitable for the TD32 element, because it does not need to control its reach.

Figure 11:
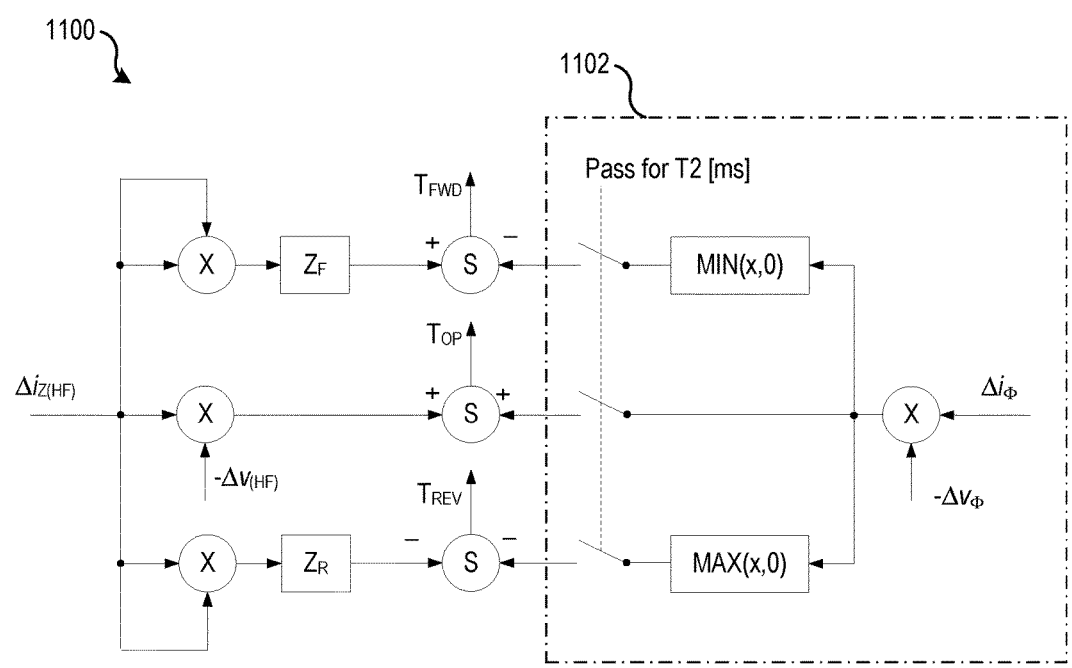
FIG. 11 illustrates a simplified functional block diagram of a system configured to determine a torque associated with a traveling wave consistent with embodiments of the present disclosure.

FIG. 11 illustrates a simplified functional block diagram of system 1100 configured to determine a torque associated with a traveling wave consistent with embodiments of the present disclosure. The torque calculation in the illustrated embodiment is based on the product of the instantaneous incremental voltage ($\Delta v$) and the instantaneous incremental replica current ($\Delta i_z$). Adaptive restraints may be applied for the operating torque using the threshold impedances $Z_F$ and $Z_R$. The operating torque may be calculated using a sign-inverted incremental voltage ($\Delta v$) so that the operating torque, TOP, is positive for forward events. The two restraining torques ($T_{FWD}$, and $T_{REV}$) are proportional to the product of the squared loop replica current and the corresponding threshold impedance magnitudes. A positive restraining torque ($T_{FWD}$) may be used for checking the forward direction, and a negative restraining torque ($T_{REV}$) may be used for checking the reverse direction. An HF filter (i.e., filter 1014 in FIG. 10) may be used in the loop quantities to provide speed for the TD32 element. Identical calculations may be performed for all six loops.

In some embodiments, the calculations of the operating torque and in one of the restraining torques may be determined using the elements in box 1102. For a very short period of time, $T_2$ the initial incremental voltage ($\Delta v_\Phi$) and current ($\Delta i_\Phi$) are of opposite polarities for a forward event and of the same polarity for a reverse event. Accordingly, the torque ($-\Delta v_\Phi \cdot i_\Phi$) may be determined for a short period of time, $T_2$, following disturbance detection. Typically, $T_2$ is on the order of a fraction of a millisecond. In one specific embodiment, $T_2$ may be less than half of one millisecond.

After a predetermined time, the system 1100 may switch to incremental quantities with reduced bandwidth to determine the direction of the fault.

Figure 12:
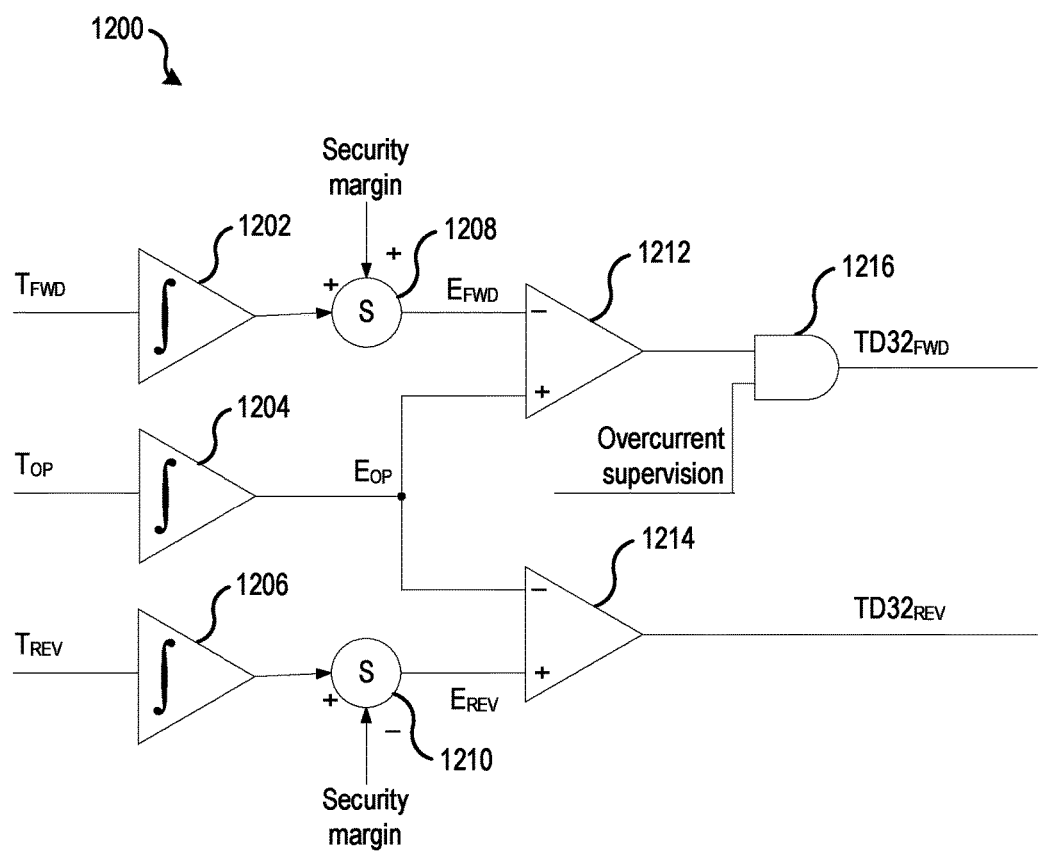
FIG. 12 illustrates a simplified functional block diagram of a system for determining a forward and a reverse restraining value based on a security margin consistent with embodiments of the present disclosure.

FIG. 12 illustrates a simplified functional block diagram of a system 1200 for determining a forward and a reverse restraining value based on a security margin consistent with embodiments of the present disclosure. In the illustrated embodiment, torque values (e.g., the values determined by system 1100 in FIG. 11) are inputs to integrators 1202, 1204, and 1206. A security margin may be added to the $T_{FWD}$ value by adder 1208 to generate the value $E_{FWD}$, and a security margin may be subtracted from the $T_{REV}$ value by adder 1210 to generate the value $E_{REV}$. The security margins may shift the integrated restraining values away from zero. The value of integrator, which generates the value $E_{OP}$, may be compared by comparators 1212 and 1214 to the values of $E_{FWD}$, and $E_{REV}$, respectively. An AND gate 1216 may also require that an overcurrent supervision condition be satisfied before system 1200 asserts a forward fault signal ($TD32_{FWD}$). A reverse fault signal ($TD32_{REV}$) may be asserted based on the output of comparator 1214.

Figure 13A:
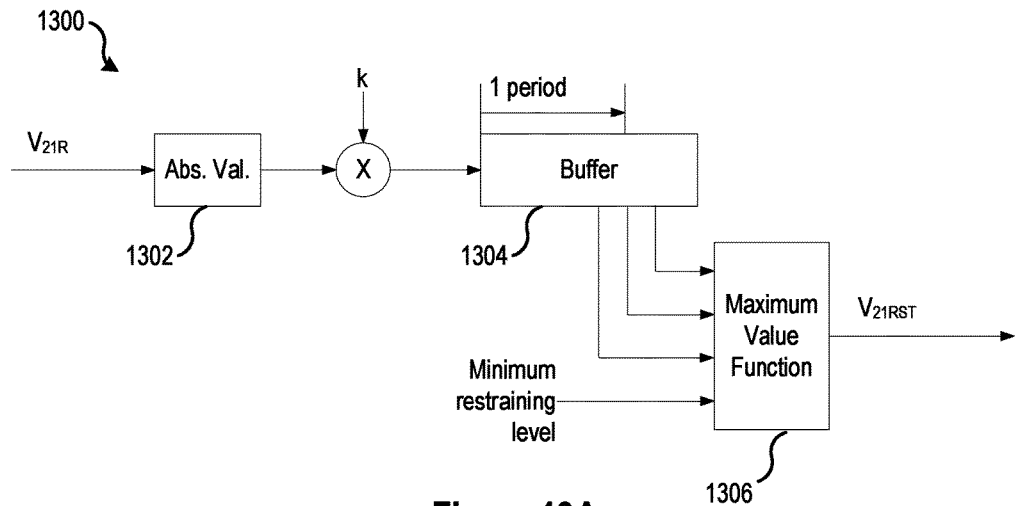
FIG. 13A illustrates a simplified functional block diagram of a system configured to determine a restraint point consistent with embodiments of the present disclosure.

FIG. 13A illustrates a simplified functional block diagram of a system 1300 configured to determine a restraint point consistent with embodiments of the present disclosure. System 1300 may be configured to calculate the change at the intended reach point (operating voltage, $V_{21OP}$) with the prefault voltage at the reach point (restraining voltage, $V_{21RST}$). For a fault at the reach point, the highest change in the voltage is when the prefault voltage collapses to zero (a bolted fault, $R_F$=0). If the change is higher ($V_{21OP}$>$V_{21RST}$), the fault must be between the relay and the reach point and the element asserts.

The operating voltage may be calculated on a per loop basis using the lower frequency spectrum in the incremental signals, as set forth in Eq. 12:

$$V_{21OP}=\Delta v_{(LF)}-m_0\cdot|Z_1|\cdot\Delta i_{Z(LF)} \qquad \text{Eq. 12}$$

The concept of a point-on-wave restraint may be used to calculate the instantaneous voltage at the reach point. The restraint of FIGS. 13A and 13B may be referred to as a point-on-wave restraint to contrast it with a constant worst-case value of the nominal system voltage plus a margin. The signals filtered at the lower frequency may be used to match the filtering for the operating voltage as set forth in Eq. 13.

$$V_{21R}=v_{(LF)}-m_0\cdot|Z_1|\cdot i_{Z(LF)} \qquad \text{Eq. 13}$$

Although Eq. 12 may not fully reflect the restraining voltage calculated, it nonetheless provides a good approximation of the actual voltage at the reach point.

System 1300 receives as an input $V_{21R}$, as expressed in Eq. 13. The absolute value of the input is determined at 1302, and the result is multiplied by a factor k. In various embodiments, factor k may be slightly above 1 for security purposes. A buffer 1304 may store one period. A maximum value may be extracted from the one-period-old data and two extra sets of data: one ahead and one beyond the exact one-period-old data. The maximum value among the minimum restraint level and the three values becomes the final restraint value, $V_{21RST}$. The minimum restraint level may enforce restraint for points on wave near the zero crossings (i.e., for time intervals when the restraining signal is very small or zero).

System 1300 may further be supervised for voltage collapse. If the voltage is detected to decrease, the logic may proceed as illustrated. However, if the voltage increases, a fault is not detected, or a blocking or restraining signal may be generated. With the operating and restraining signals calculated, they may be compared to determine a fault using the time-domain distance element as described herein.

Figure 13B:
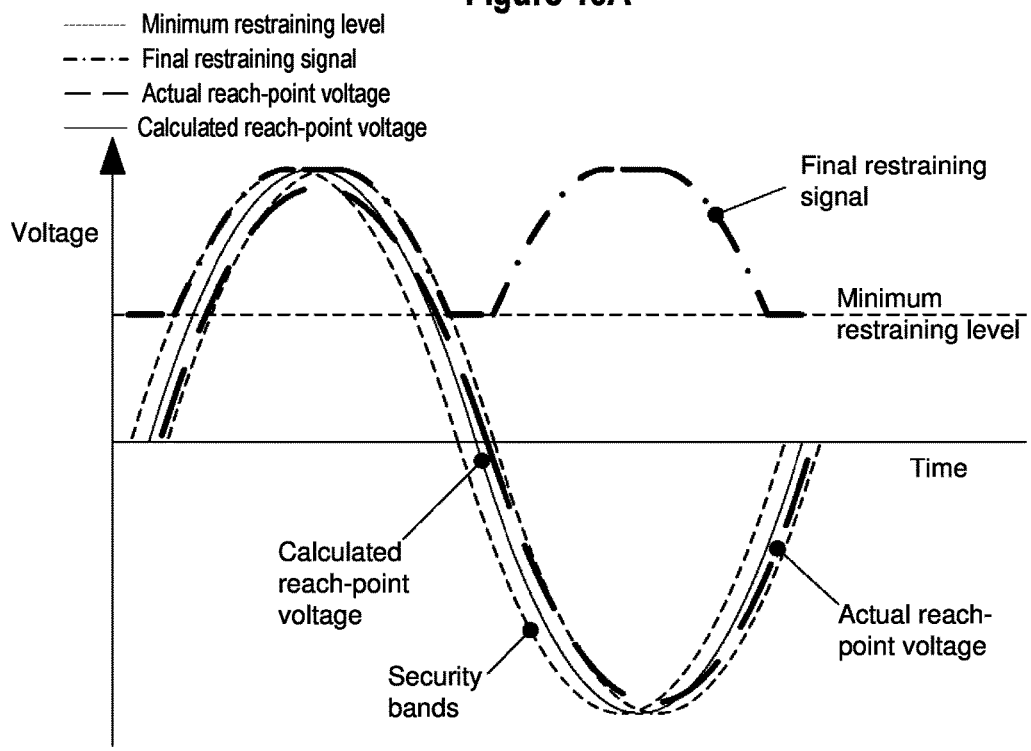
FIG. 13B illustrates a plot over one period of a wave form of a calculated reach-point voltage, an actual-reach point voltage, security bands, and a first restraining signal consistent with embodiments of the present disclosure.

FIG. 13B illustrates a plot over one period of a wave form of a calculated reach-point voltage, an actual-reach point voltage, security bands, and a first restraining signal consistent with embodiments of the present disclosure. The plot illustrates the calculation of the actual reach point voltage, along with a signal that envelops the actual reach point voltage assuming the various sources of errors, but is sufficiently small as possible to increase speed and sensitivity.

Figure 14:
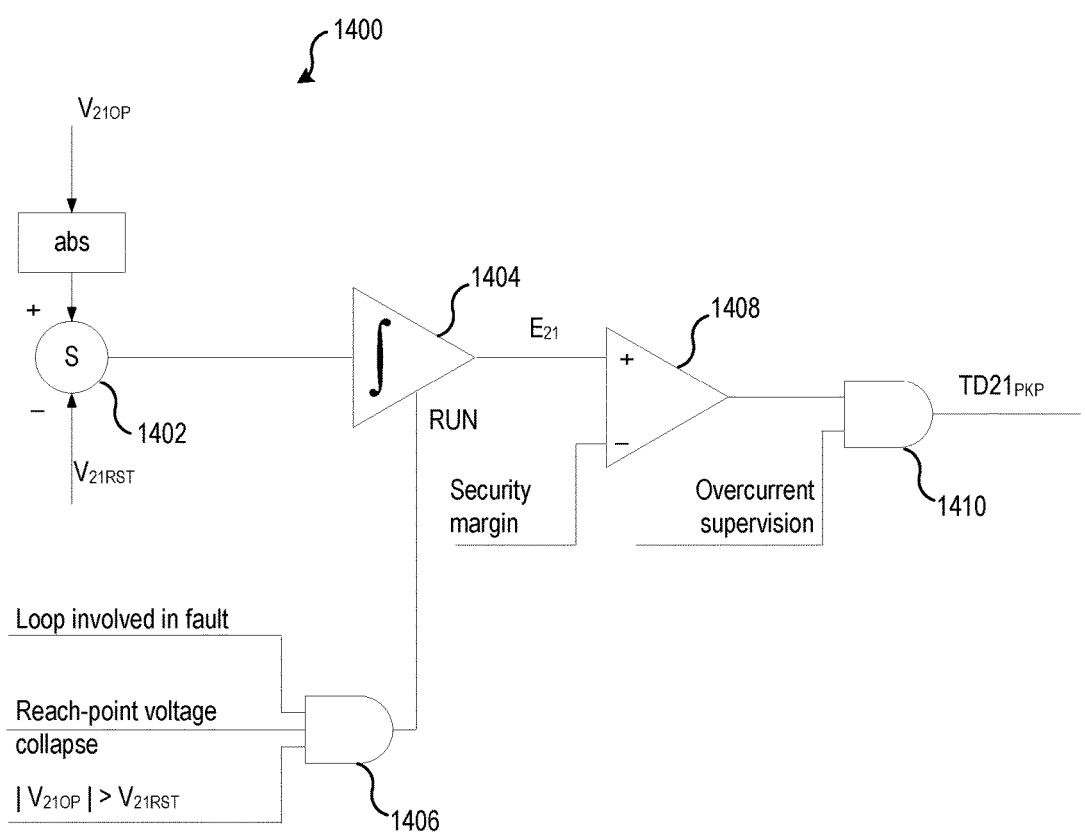
FIG. 14 illustrates a functional block diagram of a protection system configured to assert if the input exceeds the restraining signal.

FIG. 14 illustrates a functional block diagram of a protection system 1400 configured to assert if the input exceeds the restraining signal. The absolute value of the operating signal, $V_{21OP}$, may be summed by adder 1402 with the restraining signal, $V_{21RST}$. The output of adder 1402 may be summed by integrator 1404. The integrator 1404 may be enabled based on the output of AND gate 1406. The AND gate 1406 is enabled when three conditions are satisfied: (1) the absolute value of the operating signal, $V_{21OP}$, is greater than the restraining signal, $V_{21RST}$; (2) the loop is involved in the fault; and (3) the reach point resulted from a voltage decrease (collapse). In general, the incremental voltage at the reach point may result from any voltage change, either a voltage decrease or increase. In various embodiments, voltage collapse may be confirmed by checking the relative polarity of the restraining voltage, $V_{21R}$, prior to the fault against the operating voltage, $V_{21OP}$. The incremental voltage at the fault should be negative for a positive restraining voltage and vice versa. This check provides extra security against switching events. By running this check, the TD21 element effectively responds to the signed restraining voltage, not the absolute value of it.

A fault may be detected by comparing the calculated voltage change at the intended reach point ($V_{21OP}$) with the actual pre-fault voltage at the reach point ($V_{21RST}$). For a fault at the reach point, the highest change in the voltage is when the pre-fault voltage collapses all the way to zero (a metallic fault). If the change is higher ($V_{21OP}>V_{21RST}$), the fault is concluded to be between the measuring point and the reach point, and the element may assert.

Figure 15:
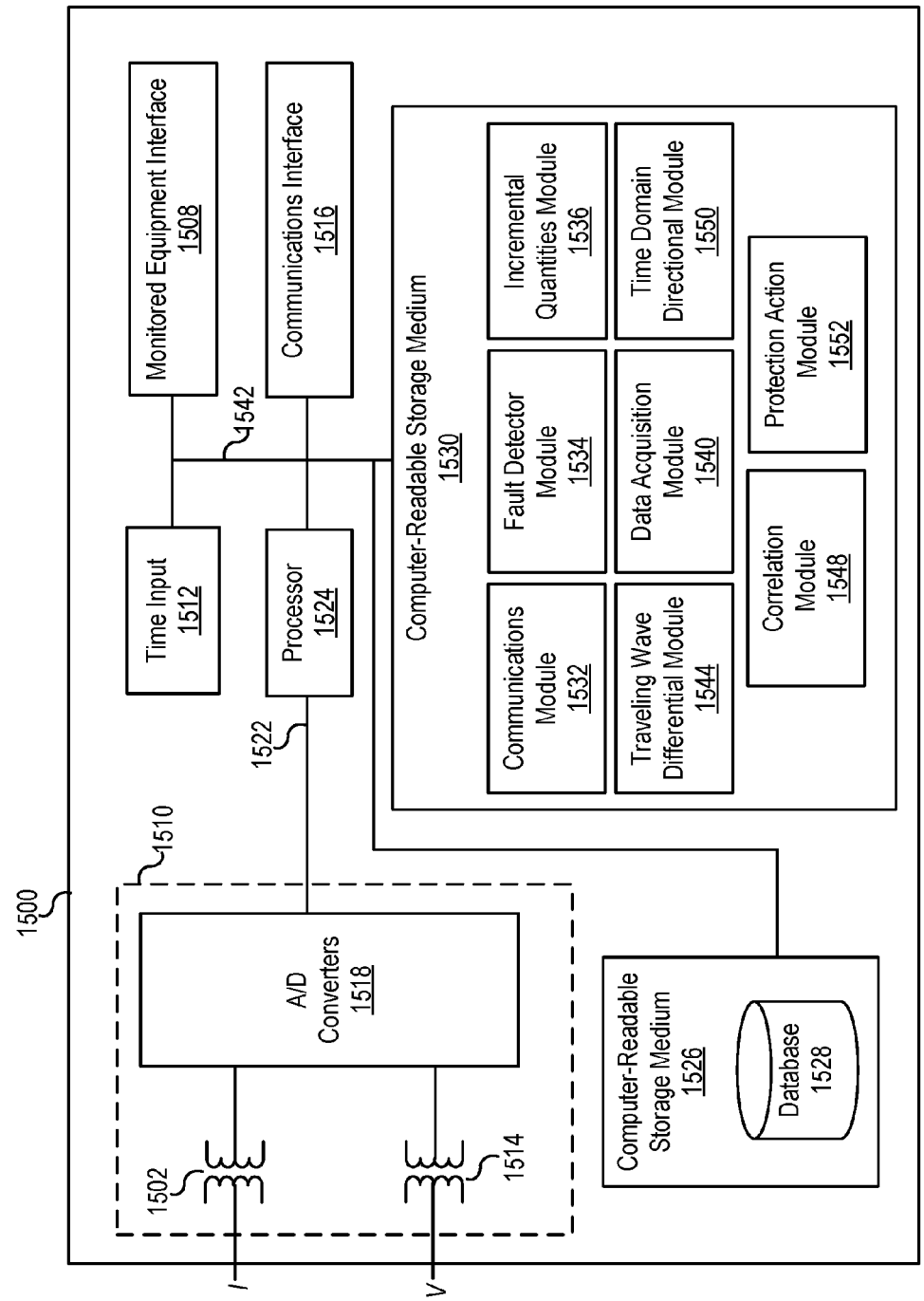
FIG. 15 illustrates a functional block diagram of a system for detecting faults and estimating a fault location using traveling waves consistent with certain embodiments of the present disclosure.

FIG. 15 illustrates a functional block diagram of a system 1500 for detecting and locating faults using time-domain quantities consistent with embodiments of the present disclosure. In certain embodiments, the system 1500 may comprise an IED system configured to, among other things, obtain and calculate time-domain quantities, detect and locate faults using a time-domain distance module, detect and locate faults using a time-domain directional module, and detect and locate faults using traveling waves. System 1500 may be implemented using hardware, software, firmware, and/or any combination thereof. In some embodiments, system 1500 may be embodied as an IED, while in other embodiments, certain components or functions described herein may be associated with other devices or performed by other devices. The specifically illustrated configuration is merely representative of one embodiment consistent with the present disclosure.

System 1500 includes a communications interface 1516 configured to communicate with devices and/or IEDs. In certain embodiments, the communications interface 1516 may facilitate direct communication with other IEDs or communicate with systems over a communications network. Communications interface 1516 may facilitate communications through a network. System 1500 may further include a time input 1512, which may be used to receive a time signal (e.g., a common time reference) allowing system 1500 to apply a time-stamp to the acquired samples. In certain embodiments, a common time reference may be received via communications interface 1516, and accordingly, a separate time input may not be required for time-stamping and/or synchronization operations. One such embodiment may employ the IEEE 1588 protocol. A monitored equipment interface 1508 may be configured to receive status information from, and issue control instructions to, a piece of monitored equipment (such as a circuit breaker, conductor, transformer, or the like).

Processor 1524 may be configured to process communications received via communications interface 1516, time input 1512, and/or monitored equipment interface 1508. Processor 1524 may operate using any number of processing rates and architectures. Processor 1524 may be configured to perform various algorithms and calculations described herein. Processor 1524 may be embodied as a general purpose integrated circuit, an application specific integrated circuit, a field-programmable gate array, and/or any other suitable programmable logic device.

In certain embodiments, system 1500 may include a sensor component 1510. In the illustrated embodiment, sensor component 1510 is configured to gather data directly from conventional electric power system equipment such as a conductor (not shown) using conventional PTs and/or CTs. The sensor component 1510 may use, for example, transformers 1502 and 1514 and A/D converters 1518 that may sample and/or digitize filtered waveforms to form corresponding digitized current and voltage signals provided to data bus 1522. Current (I) and voltage (V) inputs may be secondary inputs from conventional instrument transformers such as, CTs and VTs. A/D converters 1518 may include a single A/D converter or separate A/D converters for each incoming signal. A current signal may include separate current signals from each phase of a three-phase electric power system. A/D converters 1518 may be connected to processor 1524 by way of data bus 1522, through which digitized representations of current and voltage signals may be transmitted to processor 1524. In various embodiments, the digitized current and voltage signals may be used to calculate time-domain quantities for the detection and the location of a fault on an electric power system as described herein.

A computer-readable storage medium 1526 may be the repository of a database 1528 containing electric power line properties for each transmission line and/or each section of each transmission line, such as impedances, resistances, propagation times, reactances, lengths, and/or the like. Another computer-readable storage medium 1530 may be the repository of various software modules configured to perform any of the methods described herein. A data bus 1542 may link monitored equipment interface 1508, time input 1512, communications interface 1516, and computer-readable storage mediums 1526 and 1530 to processor 1524.

Computer-readable storage mediums 1526 and 1530 may be separate mediums, as illustrated in FIG. 15, or may be the same medium (i.e. the same disk, the same non-volatile memory device, or the like). Further, the database 1528 may be stored in a computer-readable storage medium that is not part of the system 1500, but that is accessible to system 1500 using, for example, communications interface 1516.

Communications module 1532 may be configured to allow system 1500 to communicate with any of a variety of external devices via communications interface 1516. Communications module 1532 may be configured for communication using a variety of data communication protocols (e.g., UDP over Ethernet, IEC 61850, etc.).

Data acquisition module 1540 may collect data samples such as the current and voltage quantities and the incremental quantities. The data samples may be associated with a timestamp and made available for retrieval and/or transmission to a remote IED via communications interface 1516. Traveling waves may be measured and recorded in real-time, since they are transient signals that dissipate rapidly in an electric power delivery system. Data acquisition module 1540 may operate in conjunction with fault detector module 1534. Data acquisition module 1540 may control recording of data used by the fault detector module 1534. According to one embodiment, data acquisition module 1540 may selectively store and retrieve data and may make the data available for further processing. Such processing may include processing by fault detector module 1534, which may be configured to determine the occurrence of a fault with an electric power distribution system.

An incremental quantities module 1536 may be configured to calculate time domain incremental quantities based on the techniques disclosed herein. The incremental quantities module 1536 may be configured to use digitized representations of current and/or voltage measurements to calculate incremental quantities therefrom. In some embodiments, system 1500 may be one of a pair of IEDs in communication with different terminals on an electric power system such as the IEDs and system of FIG. 1. In one embodiment, each IED of a pair of IEDs calculates incremental quantities in its own incremental quantities module 1536 for later processing and sharing between the IEDs. In another embodiment, system 1500 may receive digitized representations from both the sensor component 1510 and from a remote IED over a communications channel, and the incremental quantities module 1536 may be configured to calculate incremental signals from both sources to calculate both local and remote incremental quantities. In some embodiments, a time-domain distance element (TD21) may operate within the incremental quantities module 1636 or the protection action module 1652. The time-domain distance element operating quantity may be calculated on a per-loop basis using a lower frequency spectrum in the incremental signals.

In various embodiments, the incremental quantities module 1536 may be configured to calculate a point-on-wave restraint restraining signal. Stated in other terms, the point-on-wave restraining signal may be a time-varying signal rather than a fixed threshold. In some embodiments, the point-on-wave restraint restraining signal may be similar to the plot illustrated in FIG. 13B. Further, the system illustrated in FIG. 13A may be implemented by the incremental quantities module 1536.

Traveling wave differential module 1544 may determine a control operation to take due to occurrence of a fault. In various embodiments, traveling wave differential module 1544 may be configured to determine the occurrence of a fault using Eqs. 5-11. Further, traveling wave differential module 1544 may be configured to implement the functions described in either FIG. 8 or FIG. 9.

A correlation module 1548 may be configured to receive local and remote incremental quantities, and to correlate them. In some embodiments, the correlation may be performed based on time alignment using time stamps associated with a plurality of measurements. The correlated values may be analyzed to determine the occurrence of a fault, the direction to a fault, and other information used by other modules in system 1500.

A time domain directional module 1550 may be configured to determine a direction (forward or reverse) to a fault.

The time domain directional module 1550 may be configured to use incremental quantities from incremental quantities module 1536 to determine a direction to a fault. In various embodiments, time domain directional module 1550 may implement the functions described in any of FIG. 10, FIG. 11, and FIG. 12.

A protective action module 1552 may be configured to implement a protective action based on the declaration of a fault by the fault detector module 1534. In various embodiments, a protective action may include tripping a breaker, selectively isolating a portion of the electric power system, etc. In various embodiments, the protective action module 1552 may coordinate protective actions with other devices in communication with system 1500.

In various embodiments system 1500 may be configured to provide protection based on instantaneous voltages and currents. Such signal components require shorter data windows but facilitate faster protection. Various embodiments of system 1500 may be configured to achieve an operating time of approximately 1 millisecond.

Figure 16A:
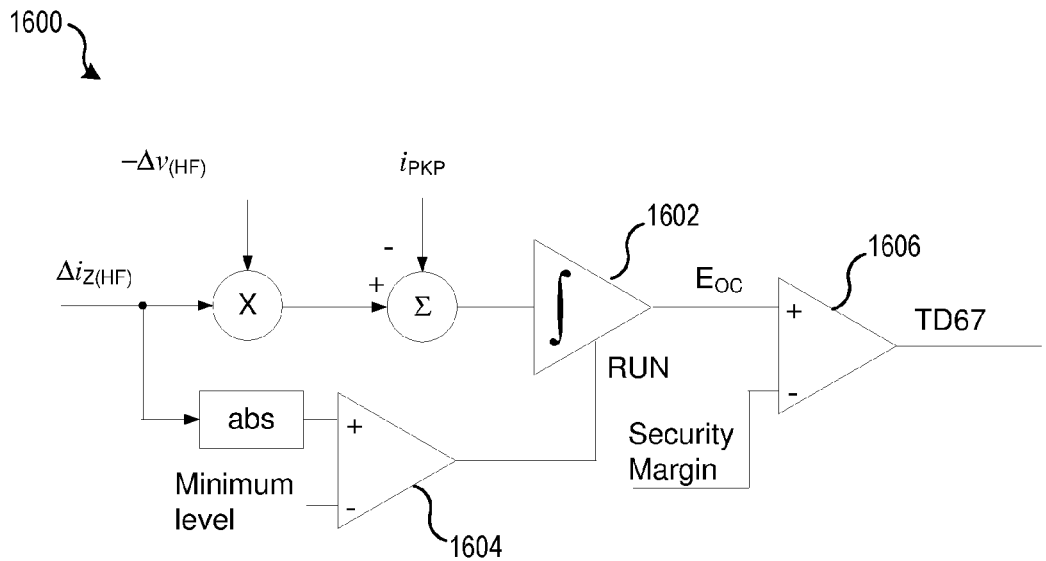
FIG. 16A illustrates a logic diagram of a system configured to generate a first-order approximation that may be used to detect an overcurrent condition consistent with embodiments of the present disclosure.

FIG. 16A illustrates a logic diagram of a system 1600 configured to generate a first-order approximation that may be used to detect an overcurrent condition consistent with embodiments of the present disclosure. System 1600 may receive as an inputs $\Delta i_{Z(Hf)}$ and $-\Delta v_{Z(Hf)}$, which may be generated for a particular loop by a system similar to the system illustrated in FIG. 10. An integrator 1602 may run once the value of $\Delta i_{Z(Hf)}$ increases above a minimum level, as determined by comparator 1604. The inputs $\Delta i_{Z(Hf)}$ and $-\Delta v_{Z(Hf)}$ may be multiplied and summed with a constant, $i_{PKP}$. The value of the constant may be proportional to the required slope, and thus may be proportional to the required pickup threshold. In one embodiment, the value of the constant may be determined using Eq. 14.

$$i_{PKP} = \frac{2\sqrt{2}}{\pi} \cdot I_{PKP} \qquad \text{Eq. 14}$$

In Eq. 14, the instantaneous values may be scaled to peak values, while the threshold is scaled to an RMS value, hence the $\sqrt{2}$. Once the integrated difference exceeds the security margin, as determined by comparator 1606, an output of system 1600 may be asserted.

System 1600 is polarity-sensitive (or "directional") because the system uses the instantaneous loop replica current, $\Delta i_{Z(Hf)}$, multiplied with the inverted sign of the loop voltage, $-\Delta v_{Z(Hf)}$. For a forward fault, the voltage is of opposite polarity than the current and the product is positive, thus allowing the element to integrate up toward assertion. For a reverse fault, the product is negative and the element integrates down, away from assertion. When the current is a high-frequency charging current oscillating between positive and negative values at hundreds of Hz, the integrator will integrate up and down yielding a secure response of the element, even if the current magnitude is above the threshold.

Figure 16B:
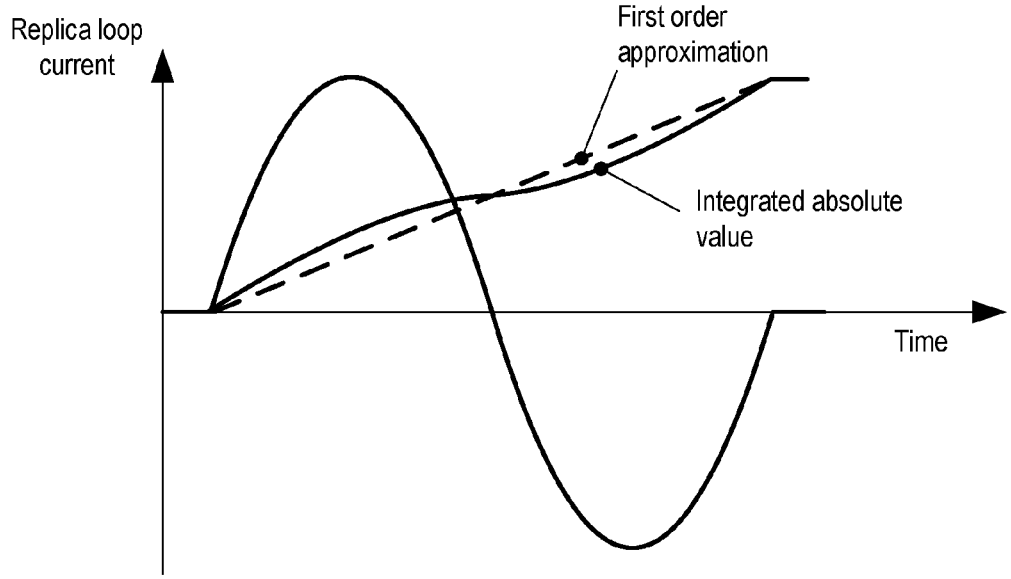
FIG. 16B illustrates a plot over time of first-order approximation generated by the system of FIG. 16A and an actual value consistent with embodiments of the present disclosure.

FIG. 16B illustrates a plot over time of first order approximation generated by the system of FIG. 16A and an actual value consistent with embodiments of the present disclosure. The plot shows an integrated absolute value of the incremental loop current, that may be approximated by the first order approximation line as illustrated. The slope of the first order approximation is directly proportional to the magnitude of the current. Thus, a line may be drawn that slopes according to the set pickup threshold, and a check can be made to determine whether the sloping line of the integrated current is above the sloping line corresponding to the set threshold. This way a simple, fast, and sufficiently accurate overcurrent comparison may be made.

Although several embodiments discussed hereinabove refer to three phases of an alternating-current electric power delivery system, the principles herein may be applied to a multiple-phase alternating-current electric power system having more or less than three phases. For example, a four-phase electric power delivery system is contemplated, as is a six-phase electric power delivery system. The principles taught herein may be applied. In other embodiments, the principles taught may be applied to a direct-current electric power delivery system. In particular, traveling wave detection using currents only in a traveling wave differential module may use current quantities from a direct-current electric power delivery system to detect faults and take control actions thereon.

Figure 17:
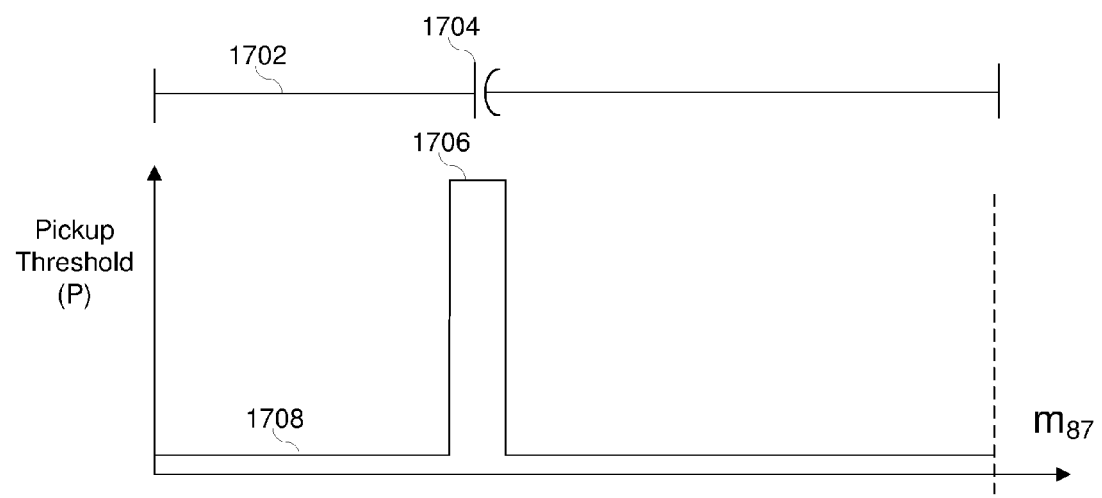
FIG. 17 illustrates a simplified one-line diagram of a power line and an associated pickup threshold values along the line consistent with embodiments of the present disclosure.

FIG. 17 illustrates a simplified one-line diagram of a power line 1702 and an associated pickup threshold values (P) along the line 1708 consistent with embodiments of the present disclosure. The power line includes an in-line series capacitor 1704 that may be switched on or off, and would launch traveling waves during such switching. The pickup threshold may be a traveling wave differential pickup threshold such as P in FIG. 8. In some embodiments, the value of the pickup threshold may be constant along the length of the power line (or for all values of $m_{87}$) except for the point 1706 at which the in-line series capacitor 1704 is located on the line 1702. At the point of the in-line series capacitor 1704 on the line 1702, the pickup threshold may be higher to allow for switching events by the in-line series capacitor without operating for the traveling waves that a switching event thereby may launch.

A traveling wave differential element, such as system 800 shown in FIG. 8, may apply a higher threshold for events very close to the series capacitor (or other equipment that may produce traveling waves as a result of normal operation) in order to restrain for traveling waves launched by the equipment during switching. At the same time, for events away from the equipment, the element applies a more sensitive pickup threshold. In various embodiments, the elevated pickup threshold value may be used at points of switching equipment, reactors, and the like, or to enhance sensitivity in specific sections of the line such as where the line crosses areas prone to fires, crossing highways, or the like.

Figure 18:
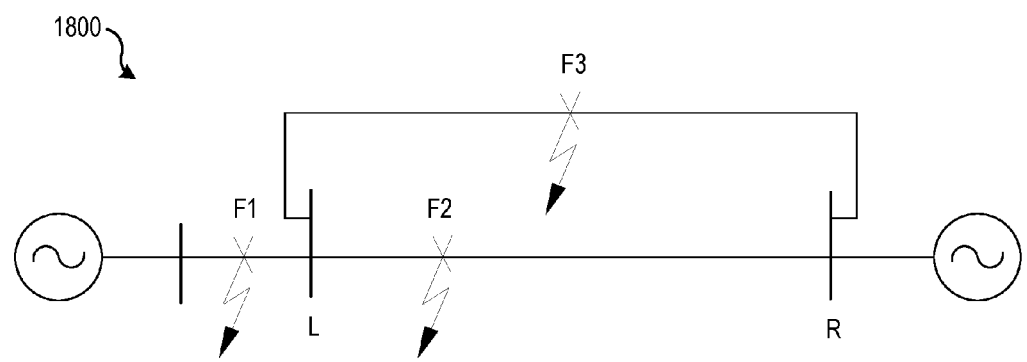
FIG. 18 illustrates a one line diagram showing the location of three faults in an electric power distribution system consistent with embodiments of the present disclosure.

FIG. 18 illustrates a one line diagram showing the location of three faults in an electric power distribution system 1800 consistent with embodiments of the present disclosure. In the case of fault 1 (F1), the fault is external because it not between the local terminal (L) and the remote terminal (R). In that case, a traveling wave traveling wave differential element would determine that the operating signal is below the restraining signal, and the element restrains with a large security margin. Further, a traveling wave directional element may determine that torque is negative, thus indicating a reverse fault direction. In contrast, fault 2 (F2) would be determined by these elements to be within a zone of protection or in the forward direction. Specifically, the traveling wave directional element would determine that torque is positive, thus indicating a forward fault direction. A reflection from beyond terminal R may show a reverse traveling wave. Such a reflection may reduce the integrated torque, but it would not reverse the polarity of the torque signal because each reflection has a lower magnitude than the original traveling wave. Finally, in the case of fault 3 (F3), the traveling waves reach the local and remote terminals at approximately the same time (the difference is less than the line propagation time) and with the same polarity. Considering the polarities and the time difference between the first traveling waves recorded at each line terminal, the fault appears to be internal; however, the traveling wave differential element would determine that the exit the protected line with the opposite polarity as would be expected as they leave the protected line. As a result, the operating signal is lower than the restraining signal, and the element would restrain.

Various systems and methods consistent with the present disclosure may include one or more time-domain line protection elements (i.e., an incremental-quantity directional element, an incremental-quantity distance element, a traveling wave differential element, and/or a traveling wave directional element). In such embodiments, the time-domain traveling wave differential element may be configured to determine at a first terminal a first index between an arrival maximum of a traveling wave generated by a fault at the first terminal and an exit maximum of the traveling wave. The traveling wave subsystem may also determine a second index between an arrival maximum of the traveling wave at the second terminal and an exit maximum of the traveling wave. An operating quantity and a restraint quantity may be determined based on a magnitude of the representations of electrical conditions in the first index and the second index. A fault may be declared based on a comparison of the operating quantity and the restraint quantity. An incremental quantities distance element may be configured to calculate a plurality of values of an operating quantity based on the plurality of time-domain representations of electrical conditions. The incremental quantities subsystem may also calculate a plurality of values of a restraining quantity based on the plurality of time-domain representations of electrical conditions. An interval during which the calculated operating quantity exceeds the calculated restraining quantity may be determined. A fault detector subsystem may be configured to declare a fault based on the calculated operating quantity exceeding the calculated restraining quantity by a security margin. A protective action subsystem configured to implement a protective action based on the declaration of the fault. An incremental quantities direction element may be configured to determine a forward torque, an operating torque, and a reverse torque based on the plurality of time-domain representations of electrical conditions. Each of the forward torque, the operating torque, and the reverse torque may be integrated over an interval. A direction of the fault may be determined based on the comparison of the forward torque, the operating torque, and the reverse torque. A time-domain traveling wave directional subsystem is configured to receive a plurality of current traveling wave and a plurality of voltage traveling wave time-domain representations based on electrical conditions in the electric power delivery system. The plurality of current and voltage traveling wave time-domain representations may be compared to respective minimum thresholds. An integral may be generated based on a product of the plurality of current and voltage traveling wave time-domain representations when the current and voltage traveling wave time-domain representations exceed the minimum thresholds. A sign of the integral may reflect whether the fault is in the forward or reverse direction. A fault detector subsystem configured to declare the fault when the sign reflects that the fault is in the forward direction and the integral exceeds a security margin.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A system configured to detect a fault in an electric power delivery system, comprising:
   a data acquisition subsystem configured to acquire a plurality of time-domain representations of electrical conditions in the electric power delivery system at each of a first terminal and a second terminal;
   an incremental quantities subsystem configured to:
      determine a forward torque, an operating torque, and a reverse torque based on the plurality of time-domain representations of electrical conditions;
      integrate each of the forward torque, the operating torque, and the reverse torque over an interval;
   a fault detection subsystem configured to:
      determine an occurrence of the fault based on a comparison of the operating torque to the forward torque and the reverse torque;
      determine a direction of the fault based on the comparison of the forward torque, the operating torque, and the reverse torque;
      declare a fault based on the comparison and the direction; and
   a protective action subsystem configured to implement a protective action based on the declaration of the fault.

2. The system of claim 1, wherein the incremental quantities subsystem is configured to determine the forward torque, the operating torque, and the reverse torque based on a first methodology during a first time period following the fault and based on a second methodology after the first time period.

3. The system of claim 2, wherein the operating torque comprises a sum of a first product of an initial loop incremental voltage and an initial loop incremental current, and a second product of a loop incremental voltage and a loop incremental current.

4. The system of claim 2, wherein the first time period lasts less than half of one millisecond.

5. The system of claim 2, wherein the reverse torque is calculated based on the second methodology as a square of a loop replica current and is scaled by a reverse impedance threshold.

6. The system of claim 2, wherein the forward torque is calculated based on the second methodology as a square of a loop replica current and is scaled by a forward impedance threshold.

7. The system of claim 2, wherein the operating torque is calculated based on the second methodology as a product of a loop replica current and a loop replica voltage.

8. The system of claim 1, wherein the incremental quantities subsystem is further configured to add a first security margin to the integral of the forward torque and to subtract a second security margin from the reverse torque.

9. The system of claim 1, wherein the fault detector subsystem is further configured to declare the fault based on the existence of an overcurrent condition.

10. The system of claim 1, wherein the incremental quantities subsystem is further configured to apply a low-pass filter to the plurality of loop quantities.

11. A method for detecting a fault in an electric power delivery system, comprising:
    acquiring a plurality of time-domain representations of electrical conditions in the electric power delivery system at each of a first terminal and a second terminal;
    determining each of a forward torque, an operating torque, and a reverse torque based on the plurality of time-domain representations of electrical conditions;
    integrating each of the forward torque, the operating torque, and the reverse torque over an interval;
    determining an occurrence of the fault based on a comparison of the operating torque to the forward torque and the reverse torque;
    determining a direction of the fault based on the comparison of the forward torque, the operating torque, and the reverse torque;
    declaring a fault based on the comparison and the direction; and
    implementing a protective action based on the declaration of the fault.

12. The method of claim 11, further comprising determining the forward torque, the operating torque, and the reverse torque based on a first methodology during a first time period following the fault and based on a second methodology after the first time period.

13. The method of claim 12, further comprising calculating the operating torque as a sum of a first product of an initial loop incremental voltage and an initial loop incremental current, and a second product of a loop incremental voltage and a loop incremental current.

14. The method of claim 12, wherein the first time period lasts less than half of one millisecond.

15. The method of claim 12, wherein the reverse torque is calculated based on the second methodology as a square of a loop replica current and is scaled by a reverse impedance threshold.

16. The method of claim 12, wherein the forward torque is calculated based on the second methodology as a square of a loop replica current and is scaled by a forward impedance threshold.

17. The method of claim 12, wherein the operating torque is calculated based on the second methodology as a product of a loop replica current and a loop replica voltage.

18. The method of claim 11, further comprising:
    adding a first security margin to the integral of the forward torque; and
    subtracting a second security margin from the reverse torque.

19. The method of claim 11, further comprising detecting an overcurrent condition;
    wherein the fault detector subsystem is further configured to declare the fault based on the existence of an overcurrent condition.

20. The method of claim 11, wherein the incremental quantities subsystem is further configured to apply a high-frequency low-pass filter to the plurality of loop quantities.

* * * * *